United States Patent
Ikeda et al.

(10) Patent No.: US 6,559,006 B2
(45) Date of Patent: May 6, 2003

(54) SEMICONDUCTOR INTEGRATED CIRCUIT AND METHOD FOR MANUFACTURING THE SAME

(75) Inventors: Shuji Ikeda, Koganei (JP); Yasuko Yoshida, Sayama (JP); Masayuki Kojima, Kokubunji (JP); Kenji Shiozawa, Hidaka (JP); Mitsuyuki Kimura, Kokubunji (JP); Norio Nakagawa, Seki-machi (JP); Koichiro Ishibashi, Warabi (JP); Yasuhisa Shimazaki, Tachikawa (JP); Kenichi Osada, Kokubunji (JP); Kunio Uchiyama, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/157,978

(22) Filed: May 31, 2002

(65) Prior Publication Data

US 2002/0155657 A1 Oct. 24, 2002

Related U.S. Application Data

(63) Continuation of application No. 09/372,007, filed on Aug. 11, 1999, now Pat. No. 6,436,753.

(30) Foreign Application Priority Data

Aug. 11, 1998 (JP) ............................................ 10-226663

(51) Int. Cl.$^7$ ......................................... H01L 21/8242
(52) U.S. Cl. ..................................... 438/256; 438/238
(58) Field of Search ................................ 438/238, 241, 438/250, 253, 256, 393, 396, 399

(56) References Cited

U.S. PATENT DOCUMENTS

| 5,455,438 A | 10/1995 | Hashimoto et al. | 257/391 |
|---|---|---|---|
| 5,543,652 A | 8/1996 | Ikeda et al. | |
| 5,592,013 A | 1/1997 | Honda | 257/392 |
| 5,668,770 A | 9/1997 | Itoh et al. | |
| 5,780,328 A * | 7/1998 | Fukuda et al. | 438/201 |
| 6,121,086 A | 9/2000 | Kuroda et al. | 438/256 |
| 6,153,910 A | 11/2000 | Oda et al. | 257/345 |
| 6,215,163 B1 | 4/2001 | King | 257/411 |
| 6,251,735 B1 | 6/2001 | Lou | 438/296 |

FOREIGN PATENT DOCUMENTS

| EP | 97-38444 | 10/1997 |
|---|---|---|
| JP | 8-167655 | 6/1996 |

* cited by examiner

*Primary Examiner*—David Nelms
*Assistant Examiner*—David Vu
(74) *Attorney, Agent, or Firm*—Antonelli, Terry, Stout & Kraus, LLP

(57) ABSTRACT

An operational margin of a memory of a semiconductor integrated circuit device including an SRAM is improved. In order to set the Vth of driving MISFETs Qd, transfer MISFETs Qt and MISFETs for load resistance QL forming memory cells of an SRAM, relatively and intentionally higher than the Vth of predetermined MISFETs of SRAM peripheral circuits and logic circuits such as microprocessor, an impurity introduction step is introduced to set the Vth of the driving MISFETs Qd, transfer MISFETs Qt and MISFETs for load resistance, separately from an impurity introduction step for setting the Vth of the predetermined MISFETs.

17 Claims, 20 Drawing Sheets

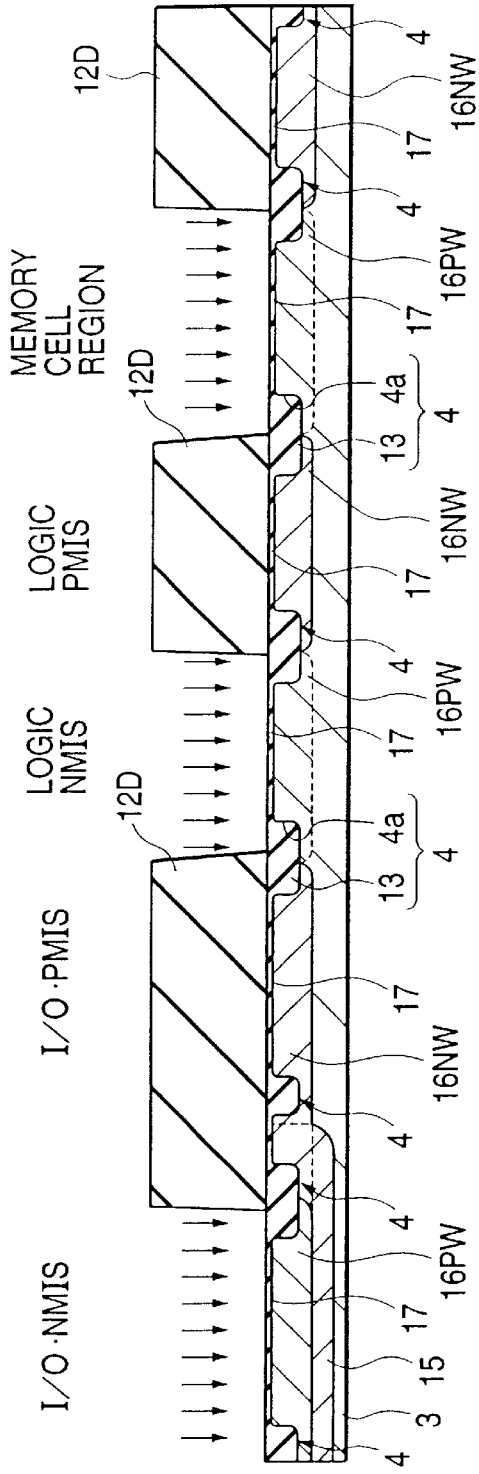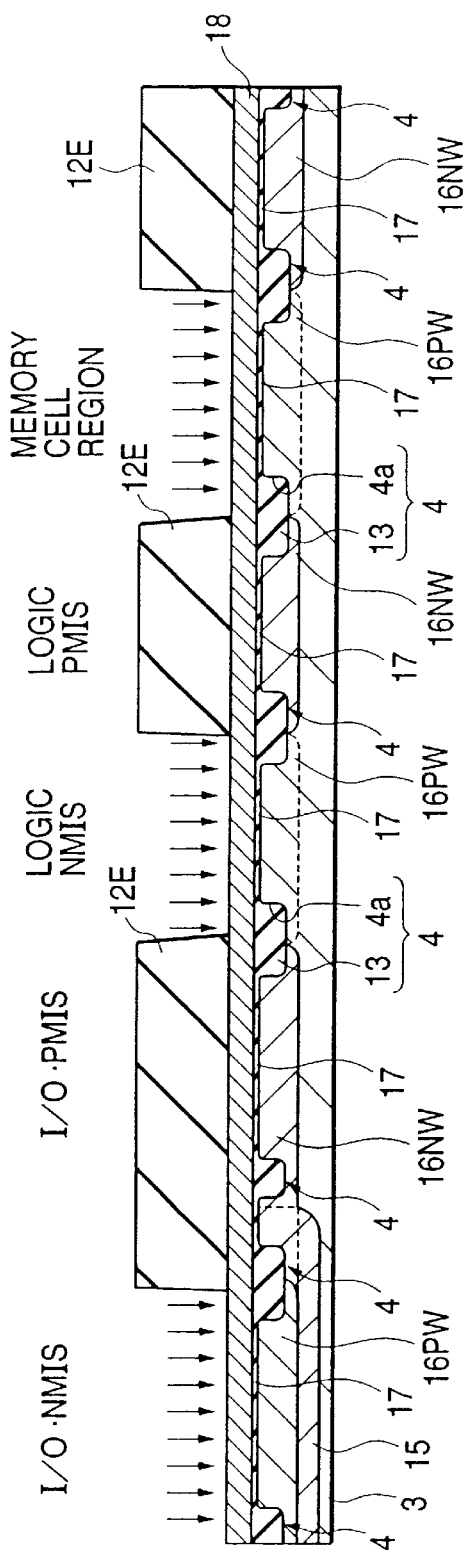

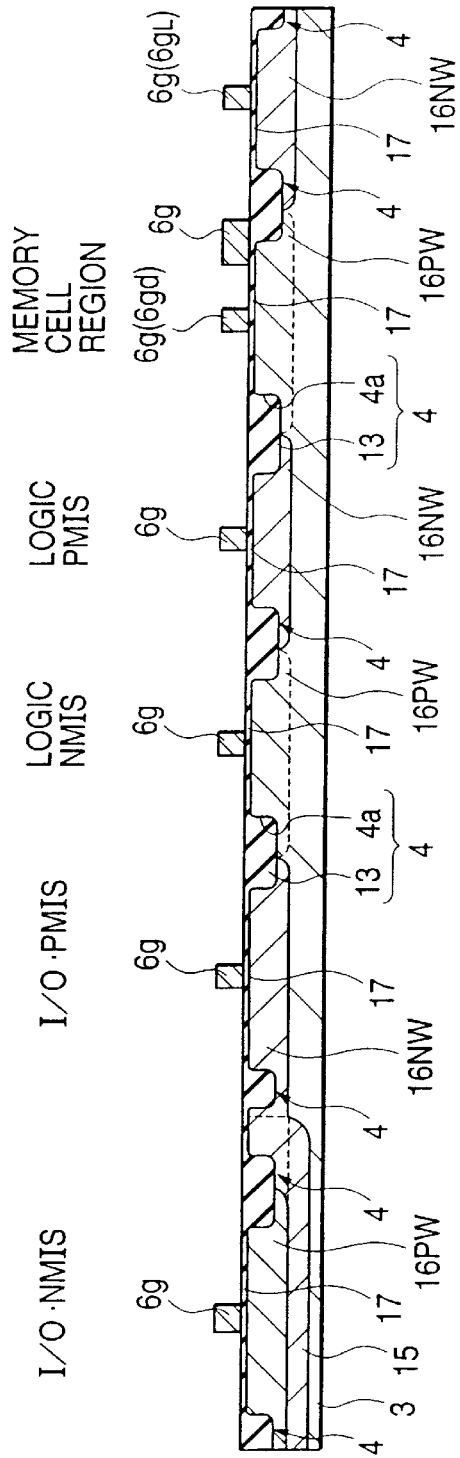
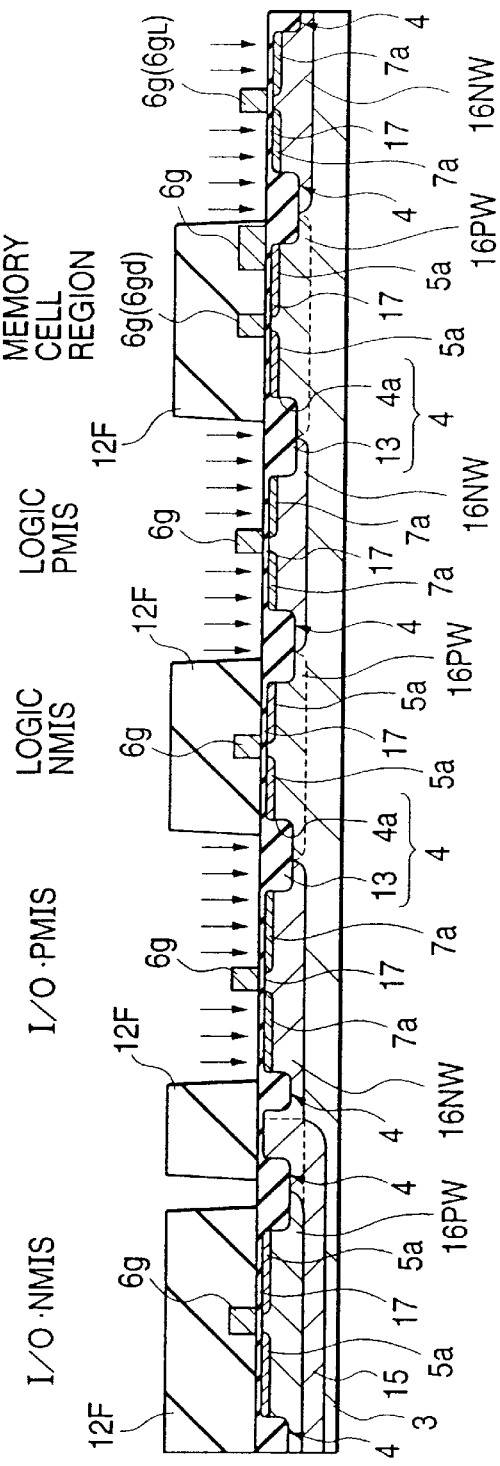

SEMICONDUCTOR INTEGRATED CIRCUIT AND METHOD FOR MANUFACTURING THE SAME

This is a continuation of parent application Ser. No. 09/372,007, filed Aug. 11, 1999 now U.S. Pat. No. 6,436,753, the entire disclosure of which is hereby incorporated by reference.

FIELD OF THE INVENTION

The present invention relates to semiconductor integrated circuit devices and methods for manufacturing the same and, more particularly, to a technique effectively used for semiconductor integrated circuit devices having a static memory (SRAM; static random access memory) and logic circuits.

BACKGROUND OF THE INVENTION

AN-SRAM is a memory device utilizing a flip-flop circuit as a memory element, the bi-stable states of which are respectively stored in association with "1" and "0" levels of information, and it is characterized in that it is easy to use because it requires no refresh operation, unlike a DRAM (dynamic random access memory). The flip-flop circuit is formed by two inverter circuits. The output of one of the inverter circuits is electrically connected to the input of the other inverter circuit, and the output of the other inverter circuit is electrically connected to the input of the first inverter circuit. Each of the inverter circuits includes a driving transistor that contributes to the storage of information and a load element for supplying a power supply voltage to the driving transistor. Further, the flip-flop circuit is provided between a pair of data lines, and a structure is employed in which a transfer transistor is interposed between the flip-flop circuit and each of the data lines to electrically connect or electrically disconnect the flip-flop circuit and the data lines.

Memory cells for such an SRAM are categorized into high resistance load type cells and CMIS (complementary metal insulator semiconductor) type cells depending on the load elements in the memory cells. In the high resistance load type, a polysilicon resistor is used as a load element. In this case, since the resistor occupies a small area and can be overlaid on a driving transistor or the like, the total area of a memory cell region can be minimized to provide a large capacity. On the other hand, a p-channel type MISFET is used as a load element in the CMIS type, which minimizes the power consumption of the same. Some CMIS type memory cells have a so-called TFT (thin film transistor) structure in which two polysilicon layers are provided on a layer above of an n-channel type MOSFET serving as a driving transistor and in which a p-channel type MOSFET to be used as a load element is formed by the polysilicon layers to also reduce the total area of the memory cell region.

For example, a semiconductor integrated circuit device having an SRAM is described in Japanese Patent Laid-Open No. 167655/1996. In order to integrate high performance logic circuits and a highly integrated CMOS type memory cell array in the same chip without increasing the complexity of the manufacturing processes, a structure is disclosed in which logic circuits are formed by a top channel type n-channel MOSFET and p-channel MOSFET and in which a memory cell is formed by directly connecting the gate electrodes of the n-channel MOSFET and p-channel MOSFET having the same conductivity.

International Publication No. W97/38444 discloses an adjustment on the threshold voltage of a transfer transistor of an SRAM.

SUMMARY OF THE INVENTION

The inventor has found that the above-described technique for semiconductor integrated circuit devices having an SRAM has the following problems.

Specifically, semiconductor integrated circuit devices having an SRAM have had a problem in that no sufficient attention has been paid to the need for setting separate threshold voltages for elements forming memory cells and other elements that arises from the trend toward higher speeds, lower power consumption and higher integration of elements and in that semiconductor integrated circuit devices have operational faults in the memory circuit which have not been revealed in the past when they are manufactured giving consideration only to ease of manufacture. For example, semiconductor integrated circuit devices having an SRAM and logic circuits provided on the same semiconductor substrate have been subjected to increasing efforts toward logic circuits and SRAM peripheral circuits (hereinafter referred to "logic circuits and the like") having higher speeds and toward lower power consumption and higher integration of the semiconductor integrated circuit devices as a whole. Efforts are being made to decrease the threshold voltage of the logic circuits and the like in order to increase the speed of the same. However, when the threshold voltages of a logic circuit and the like and a memory circuit are set at the same step taking only factors such as ease of manufacture into consideration without considering the significant trend toward increased speed of a logic circuit and the like and lower power consumption of a semiconductor integrated circuit device, the noise margin of memory cells in the memory circuit is reduced although the operating speed of the logic circuit and the like can be improved. Studies made by the inventors have revealed that this causes operational faults of the memory circuit which have not occurred even with the threshold voltages of the logical circuit and the like and the memory circuit set at the same step.

It is an object of the invention to provide a technique which makes it possible to improve the operational margin of a memory of a semiconductor-integrated circuit device having an SRAM.

It is another object of the invention to provide a technique which makes it possible to reduce the power consumption of a semiconductor integrated circuit device having an SRAM.

It is an object of the invention to provide a technique which makes it possible to improve the margin of writing to a memory of a semiconductor integrated circuit device having an SRAM.

The above and other objects and novel features of the invention will be apparent from the description provided in this specification and the accompanying drawings.

Typical aspects of the invention disclosed in this specification can be briefly described as follows.

A semiconductor integrated circuit device according to the invention has a plurality of first field effect transistors forming a memory cell of an SRAM and a second field effect transistor provided on a semiconductor substrate, in which the threshold voltage of at least one first field effect transistor among said plurality of first field effect transistors is relatively higher than the threshold voltage of said second field effect transistor.

A method of manufacturing a semiconductor integrated circuit device according to the invention, and having a plurality of first field effect transistors forming a memory cell of an SRAM and a second field effect transistor formed on a semiconductor substrate, includes an impurity introduction step for selectively introducing a first impurity into a region to form at least one of said first field effect transistors on said semiconductor substrate in order to set the threshold voltage of said at least one first field effect transistor among said plurality of first field effect transistors relatively higher than the threshold voltage of said second field effect transistor.

A method of manufacturing a semiconductor integrated circuit device according to the invention, and having a plurality of first field effect transistors forming a memory cell of an SRAM and a second field effect transistor formed on a semiconductor substrate, includes a step of selectively introducing nitrogen into the region to form said second field effect transistor on said semiconductor substrate and thereafter forming a gate insulation film on said semiconductor substrate in order to set the threshold voltage of said at least one first field effect transistor among said plurality of first field effect transistors relatively higher than the threshold voltage of said second field effect transistor.

BRIEF DESCRIPTION OF THE DRAWINGS

FIG. 10 is a sectional view of a major part of the semiconductor integrated circuit device in FIG. 1 at a manufacturing step subsequent to that shown in FIG. 9.

FIG. 11 is a sectional view of a major part of the semiconductor integrated circuit device in FIG. 1 at a manufacturing step subsequent to that shown in FIG. 10.

FIG. 12 is a sectional view of a major part of the semiconductor integrated circuit device in FIG. 1 at a manufacturing step subsequent to that shown in FIG. 11.

FIG. 13 is a sectional view of a major part of the semiconductor integrated circuit device in FIG. 1 at a manufacturing step subsequent to that shown in FIG. 12.

DESCRIPTION OF THE PREFERRED
EMBODIMENTS

Modes for carrying out the invention will now be described in detail with reference to the drawings (parts having like functions are given like reference numbers throughout the drawings and will not be described repeatedly).

Embodiment 1

Figure 18:
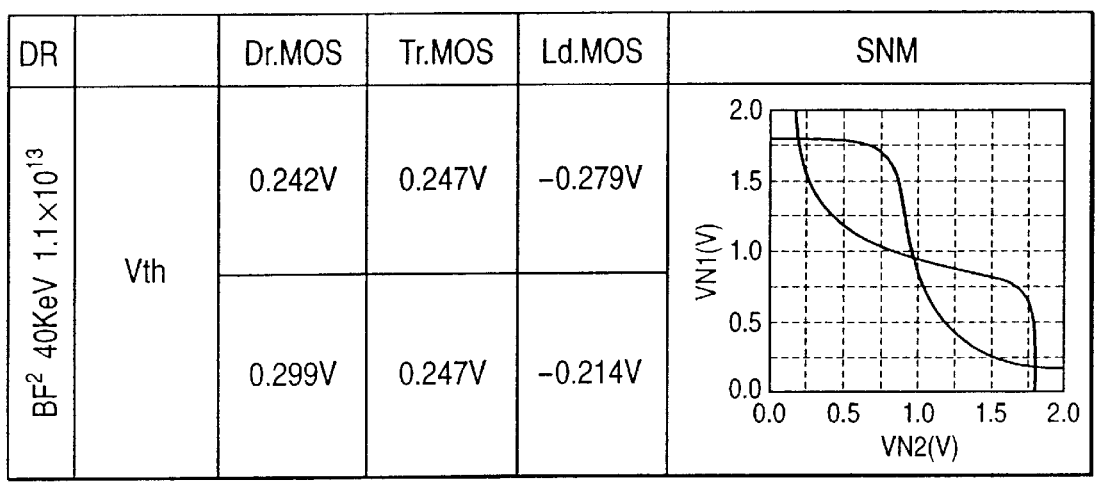
FIG. 18 is a table which illustrates SNM characteristics of the semiconductor integrated circuit device in FIG. 1.
Figure 19:
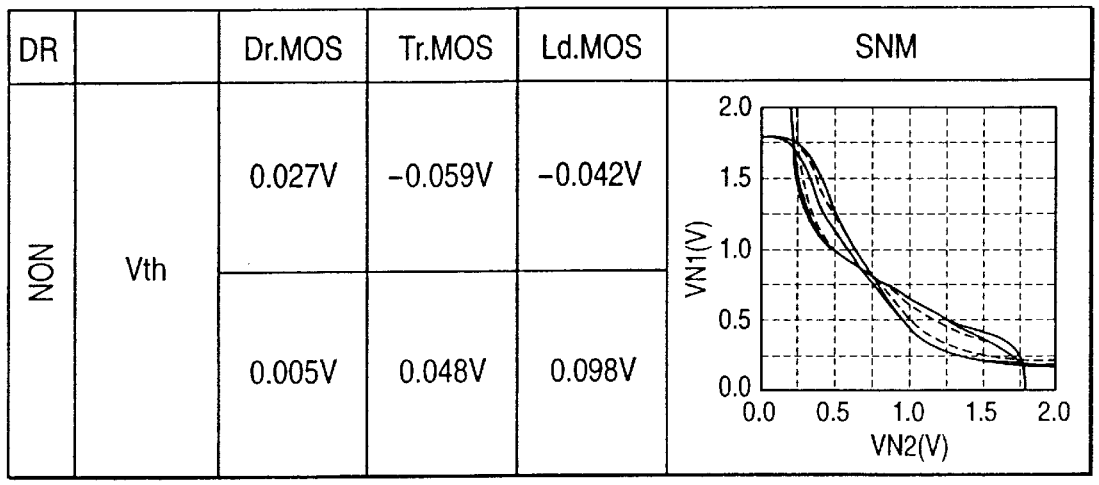
FIG. 19 is a table which illustrates SNM characteristics of a technique studied by the inventor for comparison to explain the effects of the semiconductor integrate circuit device in FIG. 1.
Figure 20:
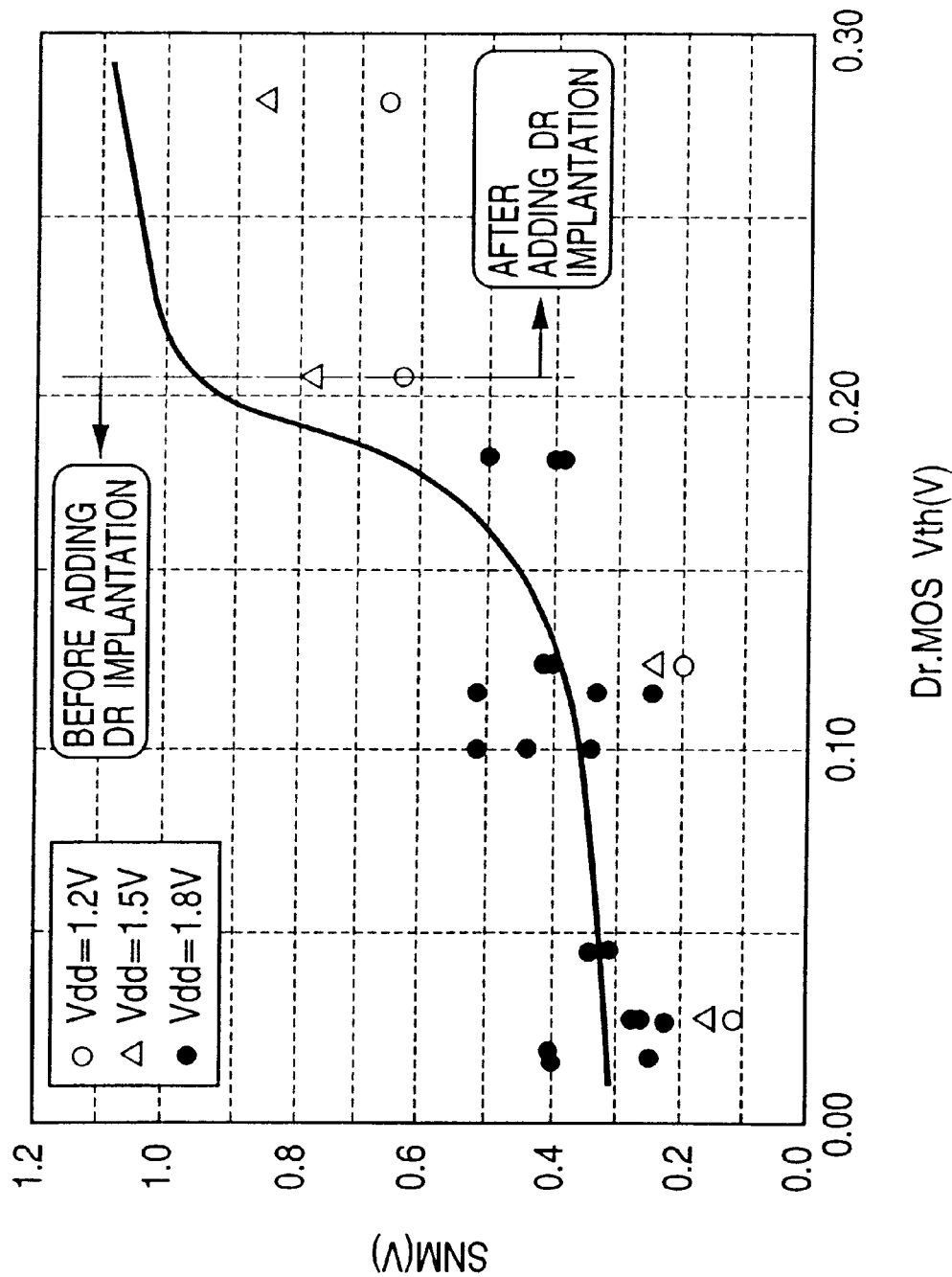
FIG. 20 is a graph showing the relationship between a threshold voltage and an SNM of a driving field effect transistor in the SRAM of the semiconductor integrated circuit device in FIG. 1.

FIGS. 1 through 4 are illustrations which will be referred to for explaining an example of the structure of a semiconductor integrated circuit device according to the invention. FIGS. 5 through 17 are sectional views of major parts of the semiconductor integrated circuit device during manufacturing steps which will be used for explaining a method of manufacturing the semiconductor integrated circuit device of FIG. 1. FIG. 18 is an illustration used for explaining the effects of the present mode for carrying out the invention. FIG. 19 illustrates a technique studied by the inventor to explain the effects of the present mode for carrying out the invention. FIG. 20 is an illustration for explaining the effects of the present mode for carrying out the invention.

In the context of the technical description presented herein, when it is stated that "a threshold voltage (hereinafter abbreviated as "Vth') is high", it means that there is an intentional increase of Vth beyond an increase in Vth attributable to a dimensional difference in the channel width or the like. Further, in the context of the technical description, Vth represents a gate voltage that appears when there is a flow of current of 1.0 µA per a unit channel width (e.g., per a width of 1 µm).

Figure 1:
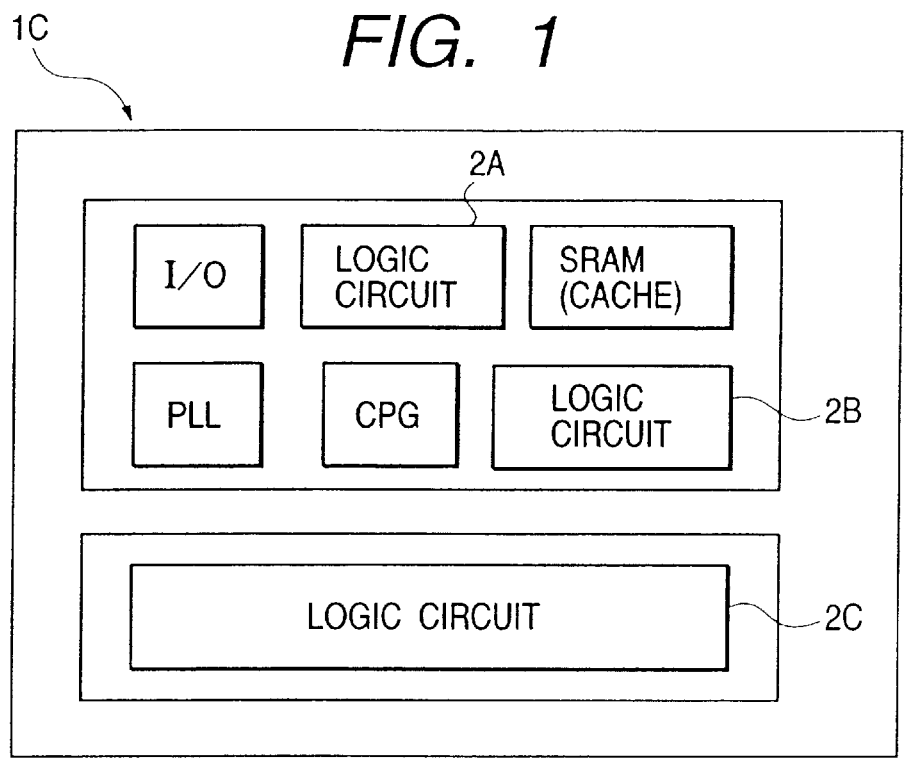
FIG. 1 is a diagram showing a configuration of circuit blocks of a semiconductor integrated circuit device, which represents a mode for carrying out the invention.

According to the technical principle of the invention, in a semiconductor integrated circuit device having MISFETs (metal insulator semiconductors) constituting an SRAM (static random access memory) and other MISFETS constituting a logic circuit, such as a microprocessor (CPU) provided on the same semiconductor substrate, as shown in FIG. 1, a separate value of Vth is set for each of the MISFETs forming an SRAM and other MISFETS. This is based on the results of studies made by the inventor, as will be described below. For example, random bit faults have occurred in memory cells of an SRAM as a result of a trend toward higher operational speeds and lower power consumption (i.e., lower power supply voltages) of semiconductor integrated circuit devices having an SRAM and a logic circuit and the like on the same semiconductor substrate and toward higher degrees of integration of elements. Upon making certain studies, the inventor discovered a fault mode in which such memory cells have a small operational margin as a major cause of such faults. A further study indicated that potential problems had been actualized with the trend toward higher speeds and lower power supply voltages of such semiconductor integrated circuit devices or higher degrees of integration of elements.

Specifically, in order to increase the speed of the logic circuit and the like of a semiconductor integrated circuit device, as described above, Vth is normally decreased. However, when Vth of the logic circuit and the like and the memory circuit is set at the same step, taking only the aspects of ease of manufacture and the like into consideration without considering the significant trend toward higher speeds of logic circuits and the like, lower power consumption of semiconductor integrated circuit devices or higher degrees of integration of elements, the Vth of MISFETs in the memory cell region is also decreased to cause operational faults in the memory which have not been revealed even with the Vth of the logic circuit and the like and the memory circuit set at the same step.

Especially, when an isolation structure (shallow trench isolation) based on the LOCOS (local oxidation of silicon) process is replaced by a trench type buried isolation structure in order to achieve a higher degree of integration of elements, the MISFETs exhibit reverse narrow channel characteristics which result in a low Vth. If the Vth of the logic circuit and the like and the memory circuit is set at the same step without considering the same and taking only the ease of manufacture into consideration, the Vth of the MISFETs in the memory cell region significantly decreases to cause operational faults in said memory which have not been revealed.

Figure 26:
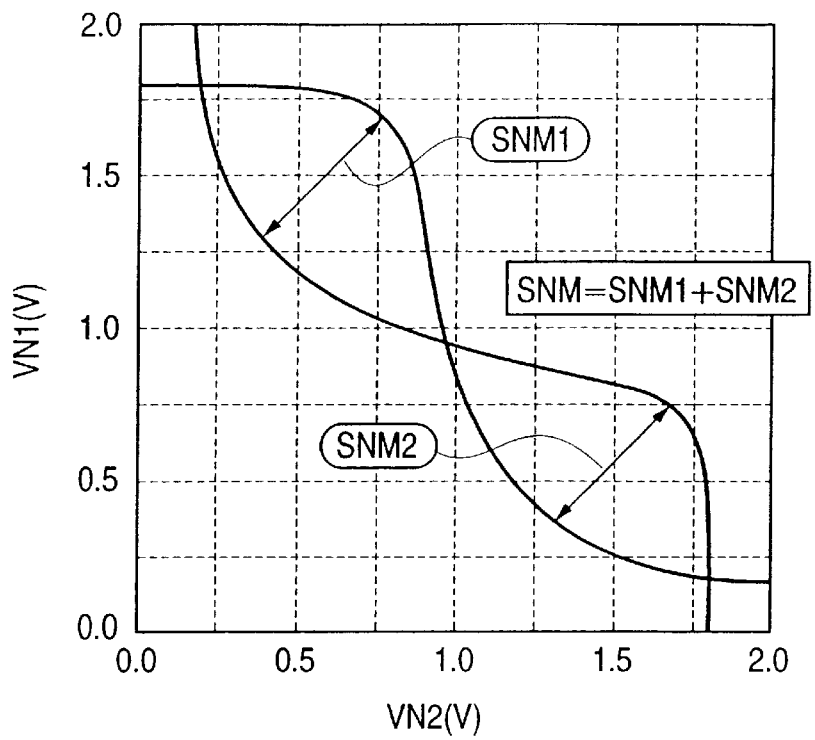
FIG. 26 is a graph of SNM characteristics of an SRAM.
Figure 27:
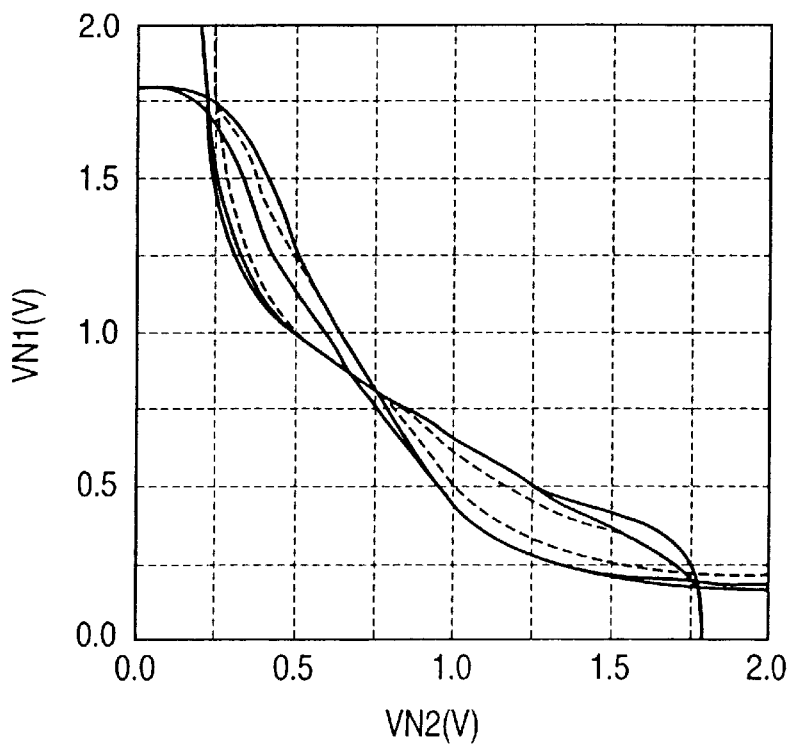
FIG. 27 is a graph of SNM characteristics of a semiconductor integrated circuit device studied by the inventor.

FIG. 26 provides waveforms showing the operational stability of a memory cell, e.g., waveforms obtained by plotting a voltage at one of the nodes of a memory cell in A 6 MISFET type SRAM relative to a voltage applied to the other node in an overlapping relationship (transfer curves). A region where the curves overlap each other represents a margin for noise, and the length of such an overlapping region (the region which is longest in the direction at an angle of 45°) is a static noise margin (SNM). The greater the overlap (i.e., the greater the SNM), the higher will be the stability at which the memory operates. However, when the Vth of a MISFET for driving a memory cell is as low as the Vth of the logic circuit and the like, particularly with the Vth of the logic circuit and the like and the memory circuit set at the same step, the SNM is small as shown in FIG. 27, which makes the operation of the memory unstable.

Figure 28:
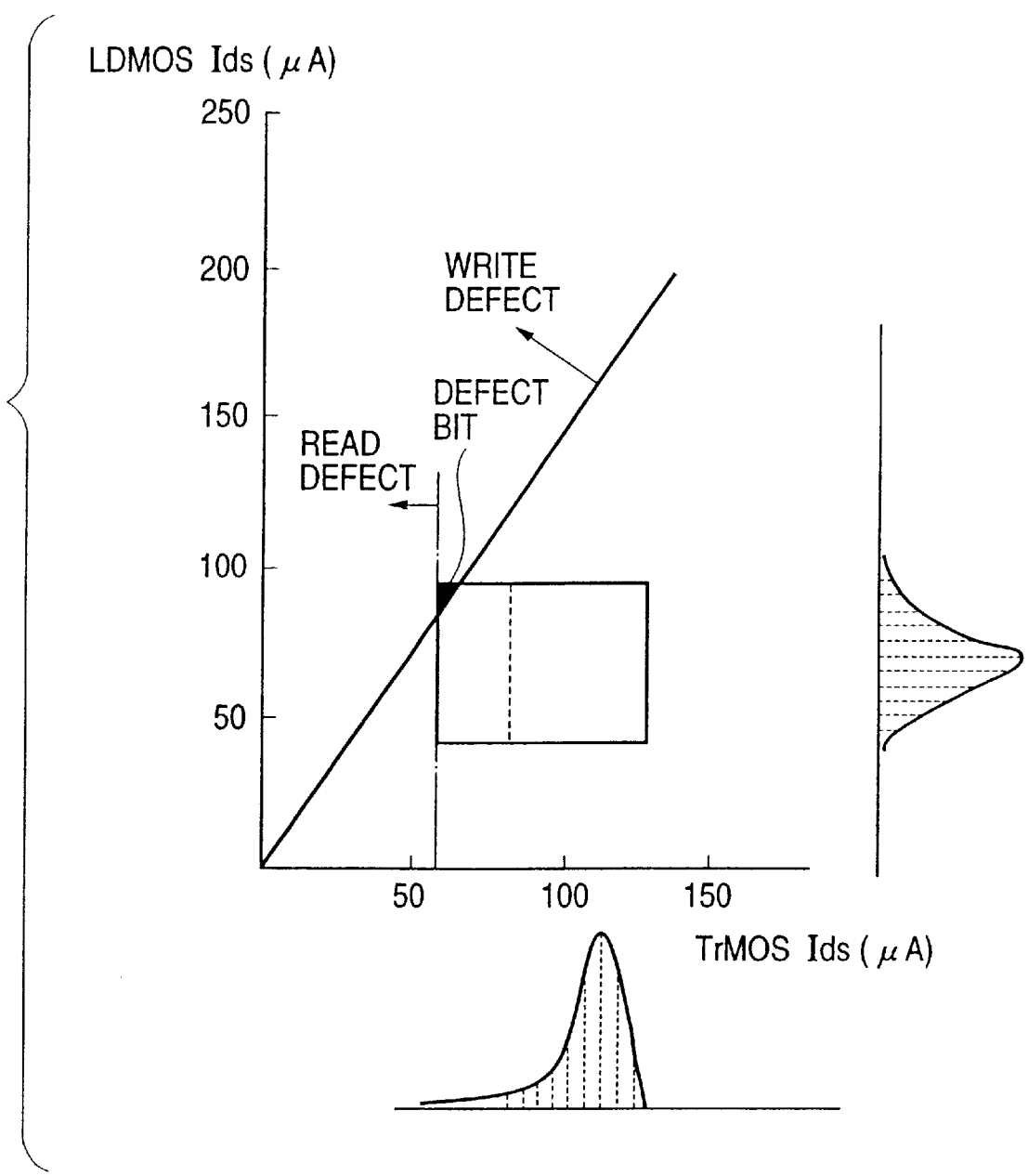
FIG. 28 is a graph showing the relationship between the drain currents of a transfer field effect transistor and a field effect transistor for load resistance forming an SRAM of a semiconductor integrated circuit device studied by the inventor.
Figure 29:
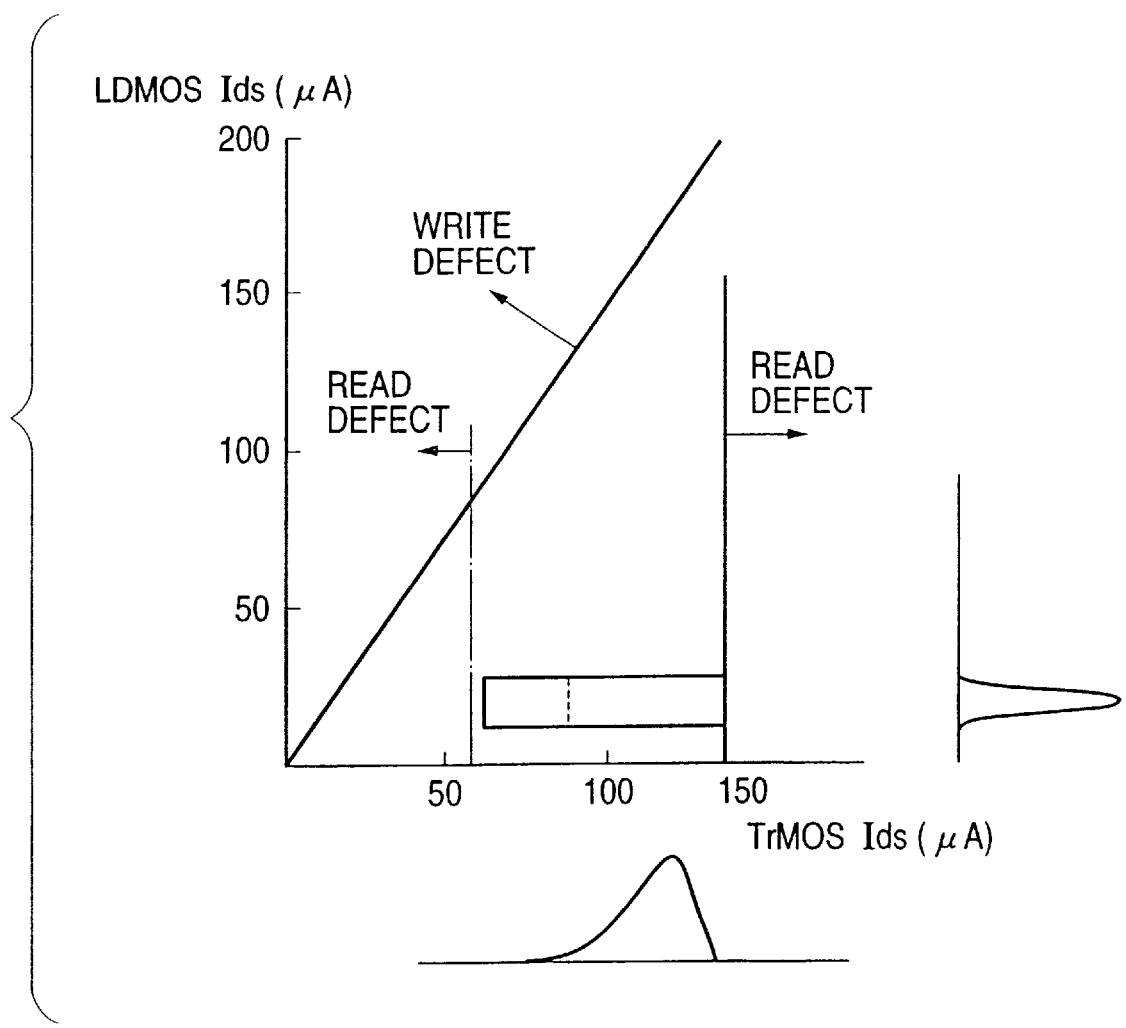
FIG. 29 is a graph showing the relationship between the drain currents of a transfer field effect transistor and a field effect transistor for load resistance forming an SRAM of a semiconductor integrated circuit device studied by the inventor.

FIGS. 28 and 29 are graphs showing the results of measurement of the drain currents of a transfer MISFET for a memory cell and a MISFET to be used as load resistance. Those figures indicate that a read fault occurs at the transfer MISFET when the Vth is too high or too low and that a write fault occurs at the MISFET used as a load resistance when the Vth is too low. That is, the present inventor has found that it is preferable to set not only the Vth of a MISFET for driving a memory cell but also the Vth of the transfer MISFET and the MISFET used as a load resistance separately from the Vth of the logic circuit and the like, depending on the operational environment, operating conditions and the like.

Next, a description will be made concerning the structure of a semiconductor integrated circuit device according to the present mode for carrying out the invention with reference to an application of a technical principle of the invention to a microprocessor having an SRAM for a cache memory as an example.

FIG. 1 shows a major circuit block provided in a semiconductor chip IC according to the present mode for carrying out the invention. Specifically, the semiconductor chip IC includes, for example, an input/output circuit I/O, logic circuits, such as a microprocessor (CPU), 2A through 2C, an SRAM for a cache memory, a phase locked loop circuit PLL, a clock pulse generation circuit CPG and the like. The power supply voltage of a high potential side of this semiconductor integrated circuit device is, for example, 2.5 V or less. The minimum gate length of MISFETs forming this semiconductor integrated circuit device is, for example, about 0.25 µm. For example, the Vth of MISFETs, which must be fast, is 0.25 V or less.

Figure 2:
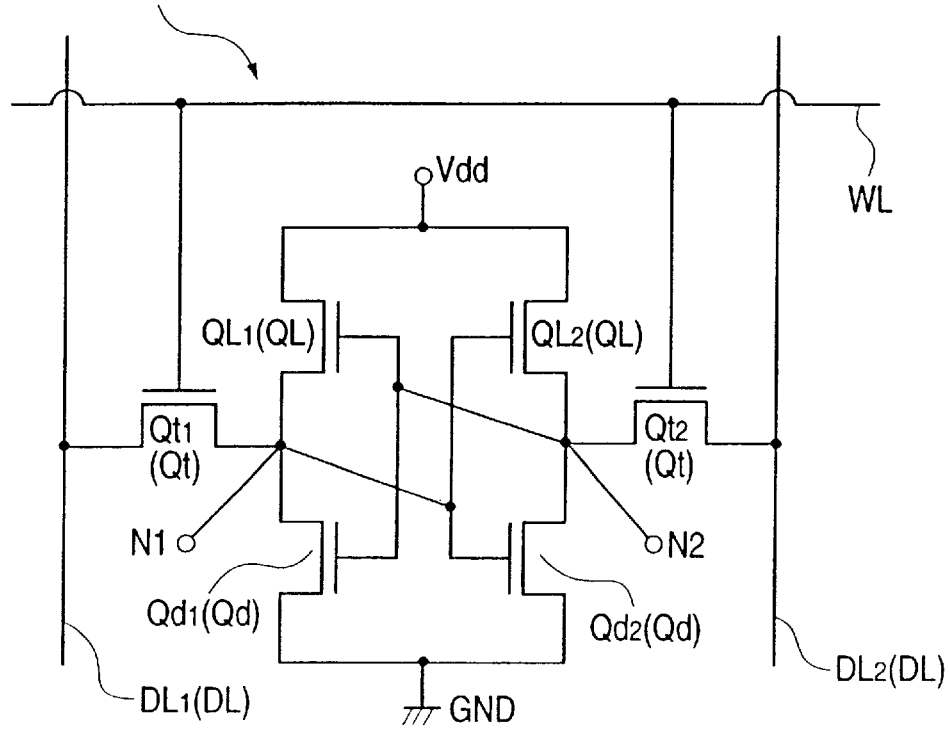
FIG. 2 is a circuit diagram of a memory cell in an SRAM of the semiconductor integrated circuit device in FIG. 1.

For example, a plurality of 6 MISFET (metal insulator semiconductor field effect transistor) type memory cells MC as shown in FIG. 2 are provided in a memory cell region of the SRAM. The memory cells MC are provided in the vicinity of the intersections of a pair of complementary data lines DL1, DL2 (DL) and a word line WL and include a pair of driving MISFETs Qd1, Qd2 (Qd; first field effect transistor), a pair of MISFETs QL1, QL2 (QL; first field effect transistor) used as a load resistance and a pair of transfer MISFETs Qt1, Qt2 (Qt; first field effect transistor). The pair of complementary data lines DL1, DL2 transmit signals which are inversions of each other.

Said pair of driving MISFETs Qd1, Qd2 and the pair of MISFETs QL1, QL2 used as a load resistance form a flip-flop circuit. The flip-flop circuit is a memory cell'. which stores one bit of information ("1" or "0") and which is electrically connected to a power supply Vdd at a high potential side at one end thereof (the side of the MISFETs QL1, QL2 used as load resistance) and is electrically connected to a power supply GND at a ground side at the other end (the side of the driving MISFETs Qd1, Qd2). For example, the voltage of the power supply vdd at the high potential side is about 1.8 V, and the voltage of the power supply GND at the ground side is 0 V.

The pair of transfer MISFETs Qt1, Qt2 are switching elements for electrically connecting and disconnecting the flip-flop circuit to and from the data lines DL1, DL2 and are interposed between input and output terminals of the flip-flop circuit (accumulation nodes N1, N2) and the data lines DL1, DL2, respectively. The gate electrodes of the pair of transfer MISFETs Qt1, Qt2 are electrically connected to the word line WL.

Figure 3:
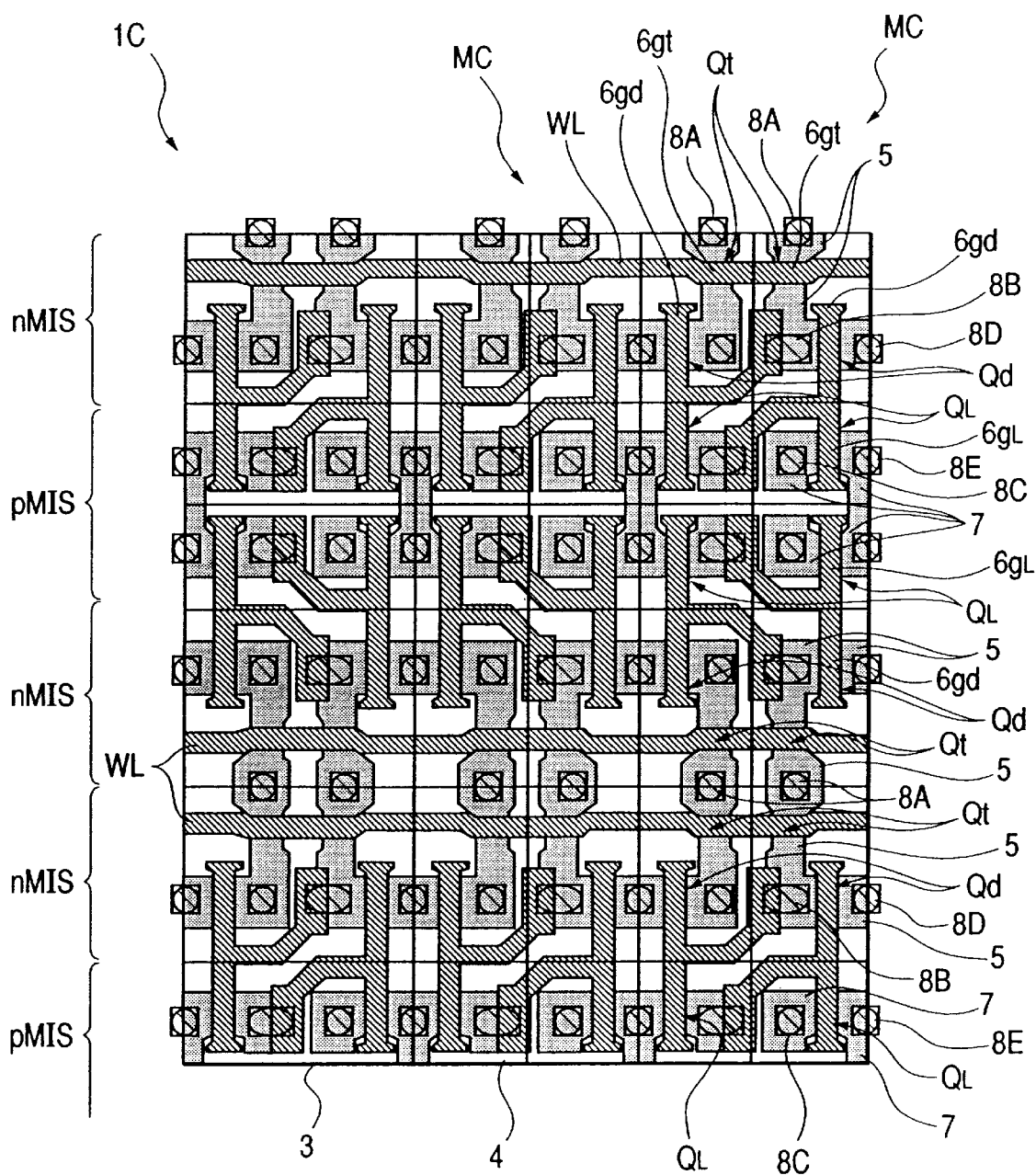
FIG. 3 is a plan view of a major part of a memory cell region of the SRAM of the semiconductor integrated circuit device in FIG. 1.
Figure 4:
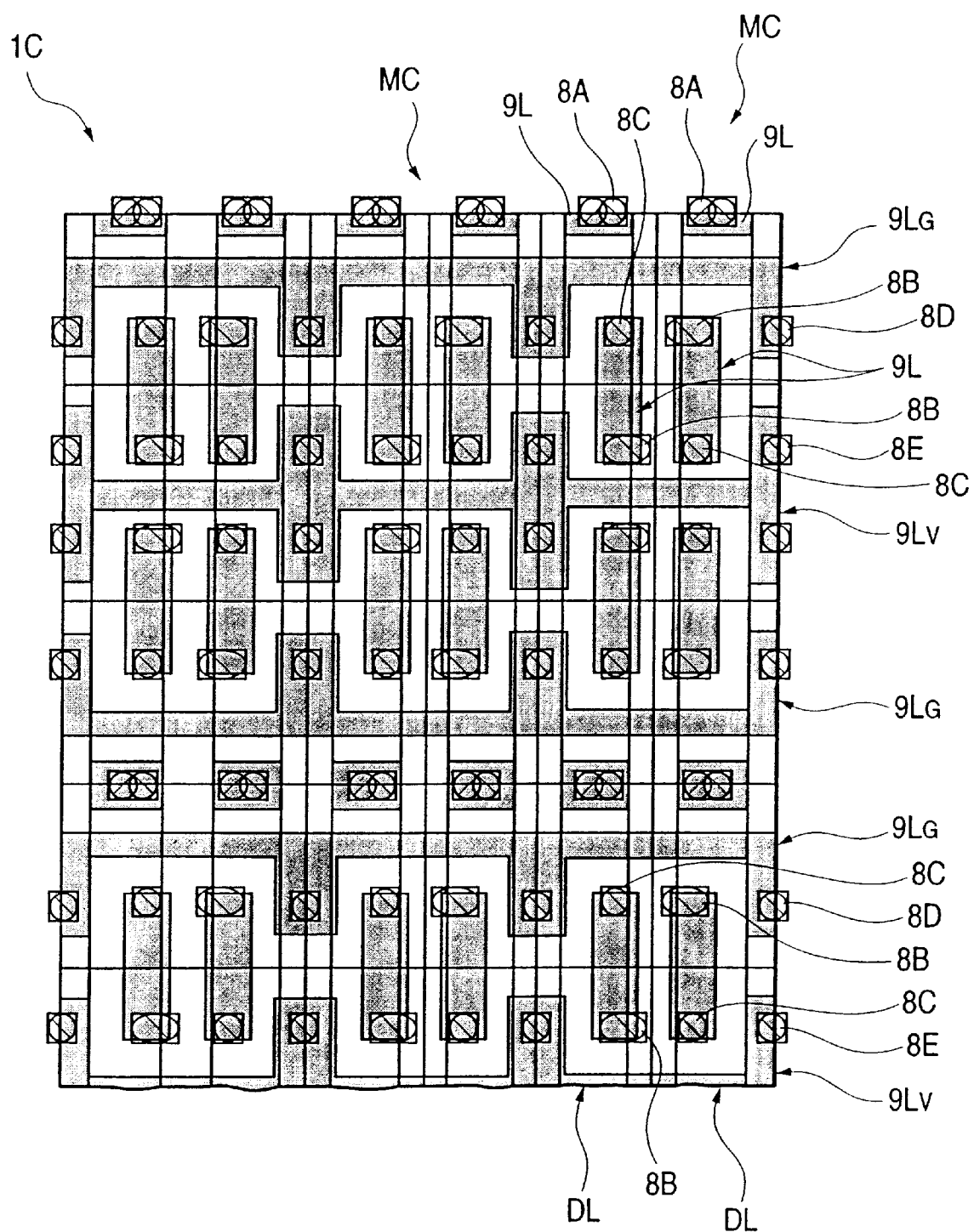
FIG. 4 is a plan view of a layer above that shown in FIG. 3 in the memory cell region of the SRAM of the semiconductor integrated circuit device in FIG. 1.

FIGS. 3 and 4 show plan views of a major part of the memory cell region. While FIG. 4 illustrates the same position as that in FIG. 3 as a plan view, it illustrates first layer wiring above the layer shown in FIG. 3 and second layer wiring as a sectional view.

A semiconductor substrate 3 is made of, for example, p-type silicon (Si). P-wells and n-wells to be described later are formed on the semiconductor substrate 3. Isolation portions 4 are formed on the principle surface of the semiconductor substrate 3. Transfer MISFETs Qt, driving MISFETs Qd and MISFETs for load resistance QL are formed in active regions surrounded by the isolation portions 4. The transfer MISFETs Qt and driving MISFETs Qd are constituted by, for example, n-channel MISFETS, and the MISFETs for load resistance QL are constituted by, for example, p-channel MISFETS. In FIG. 3, NMIS represents a region where n-channel MISFETs are formed, and PMIS represents a region where p-channel MISFETs are formed. In-the present mode for carrying out the invention, the designed channel widths of the driving MISFETs Qd, transfer MISFETs Qt and MISFETs for load resistance QL are smaller than the designed channel width of MISFETs forming logic circuits and SRAM peripheral circuits (second field effect transistors). The term "designed" implies the fact that some error may be included.

The transfer MISFETs Qt include an n-type semiconductor region 5 and a gate electrode 6gt; the driving MISFETs Qd include an n-type semiconductor region 5 and a gate electrode 6gd; and the MISFETs for load resistance QL include a p-type semiconductor region and a gate electrode 6gL.

The n-type semiconductor regions 5 are regions where the sources and drains of the transfer MISFETs Qt and driving MISFETs Qd are formed and are formed by introducing, for example, phosphorus (P) or arsenic (As) into said p-wells. One of such n-type semiconductor regions 5 is a region shared by a transfer MISFET Qt and a driving MISFET Qd which functions as wiring to electrically connect both of the MISFETS. The other n-type semiconductor region 5 of the transfer MISFET Qt is electrically connected to a data line DL (see FIG. 4) through a connection hole 8A for the data line. The data lines DL are made of for example, aluminum, aluminum-silicon-copper alloy or the like and are formed in the second wiring layer. The n-type semiconductor regions 5 shared by transfer MISFETs Qt and driving MISFETs Qd are connected to the gate electrodes 6gdm 6gL of other driving MISFETs Qd and MISFETs for load resistance QL which are to be paired therewith through connection holes 8B and are electrically connected to first layer wiring 9L (see FIG. 4). The first layer wiring 9L is made of, for example, aluminum, aluminum-silicon-copper or the like and is connected to one of p-type semiconductor regions 7 of a load resistance MISFET QL through a connection hole 8C. The other n-type semiconductor regions 5 of the driving MISFETs Qd are electrically connected to first layer wiring 9LG (see FIG. 4) for the power supply GND at the low potential side (see FIG. 2) through connection holes 8D. The other p-type semiconductor regions 7 of the load resistance MISFET QL are electrically connected to first layer wiring 9tv (see FIG. 4) for the power supply Vdd at the high potential side (see FIG. 2) through connection holes 8E.

The gate electrodes 6gt of the transfer MISFETs Qt are constituted by a part of word lines WL and are in the form of planar band-shaped patterns extending horizontally in FIG. 3. The gate electrodes 6gd, 6gL of the driving MISFETs Qd and MISFETs for load resistance QL are formed in a part of an integral gate pattern. A part of this gate pattern extends diagonally to gate pattern portions connecting the gate electrodes 6gd, 6gL and is formed in a planar Y-shaped configuration as a whole. The ends of the diagonally extending portions of the gate pattern are electrically connected to the n-type semiconductor regions 5 and the first layer wiring 9L through said connection holes 8B to function as wiring. One memory cell MC has two gate patterns which are adjacent to each other in the horizontal direction of FIG. 3. The gate electrodes 6gt, 6gL are formed on a gate insulation film to be described later and are constituted by, for example, a single film of low resistance polysilicon, a multi-layer film formed by providing a silicide layer made of tungsten silicide or the like on a low resistance polysilicon film or a multilayer film formed by providing a metal film such as tungsten on a low resistance polysilicon film with titanium nitride, tungsten nitride or the like interposed therebetween.

A description will now be made with reference to FIGS. 5 through 17 to explain an example of a method of manufacturing a semiconductor integrated circuit device according to the present mode for carrying out the invention. Throughout the drawings, I/O-NMIS represents a region where an n-channel type MISFET for forming an input/output circuit is formed; I/O-PMIS represents a region where a p-channel type MISFET for forming the input/output circuit is formed; logic-NMIS represents a region where an n-channel type MISFET for a logic circuit is formed; and logic-NMIS represents a region where a p-channel type MISFET for the logic circuit is formed. Examples of regions where driving MISFETs and MISFETs for load resistance are formed are shown in the memory cell region shown in FIGS. 5 through 17.

Figure 5:
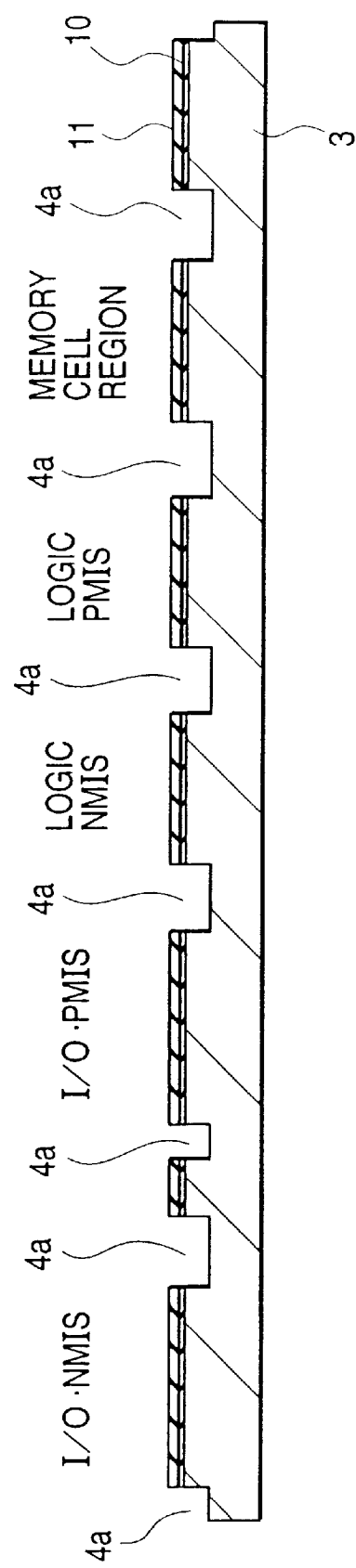
FIG. 5 is a sectional view of a major part of the semiconductor integrated circuit device in FIG. 1 at a manufacturing step of the same.

For example, as shown in FIG. 5, a p-type semiconductor substrate (a semiconductor wafer at this stage) 3 having a specific resistance on the order of 10 gcm is first subjected to wet oxidation at 800° C. to form a thin silicon oxide film 10 having a thickness of about 10 nm on the surface thereof and, thereafter, a silicon nitride film 11 having a thickness of about 200 nm is deposited thereon using the CVD (chemical vapor deposition) method. The silicon oxide film 10 is formed to moderate stress that acts on the semiconductor substrate 3 when silicon oxide films embedded in element isolating grooves are sintered (vitrified) at a later step. Since the silicon nitride film 11 has the property of resisting oxidation, it is used as a mask to prevent oxidation of the substrate surface thereunder (active region)

Subsequently, the silicon nitride film 11, silicon oxide film 10 and semiconductor substrate 3 are subjected to dry etching using a photoresist film as a mask to form isolation grooves 4a having a depth of about 300 to 400 nm on the semiconductor substrate 3 in element isolation regions. The isolation grooves 4a may be formed by performing dry etching of the silicon nitride film 11 using a photoresist film as a mask, removing the photoresist film, and thereafter performing dry etching of the silicon oxide film 10 and semiconductor substrate 3 using the patterned silicon nitride film 11 as a mask.

Next, in the present mode for carrying out the invention, a process (hereinafter referred to as "first process) as described below is performed to set the Vth of driving MISFETS, transfer MISFETs and MISFETs for load resistance forming memory cells of an SRAM, relatively and intentionally higher than the Vth of predetermined MISFETs of SRAM peripheral circuits and logic circuits.

Figure 6:
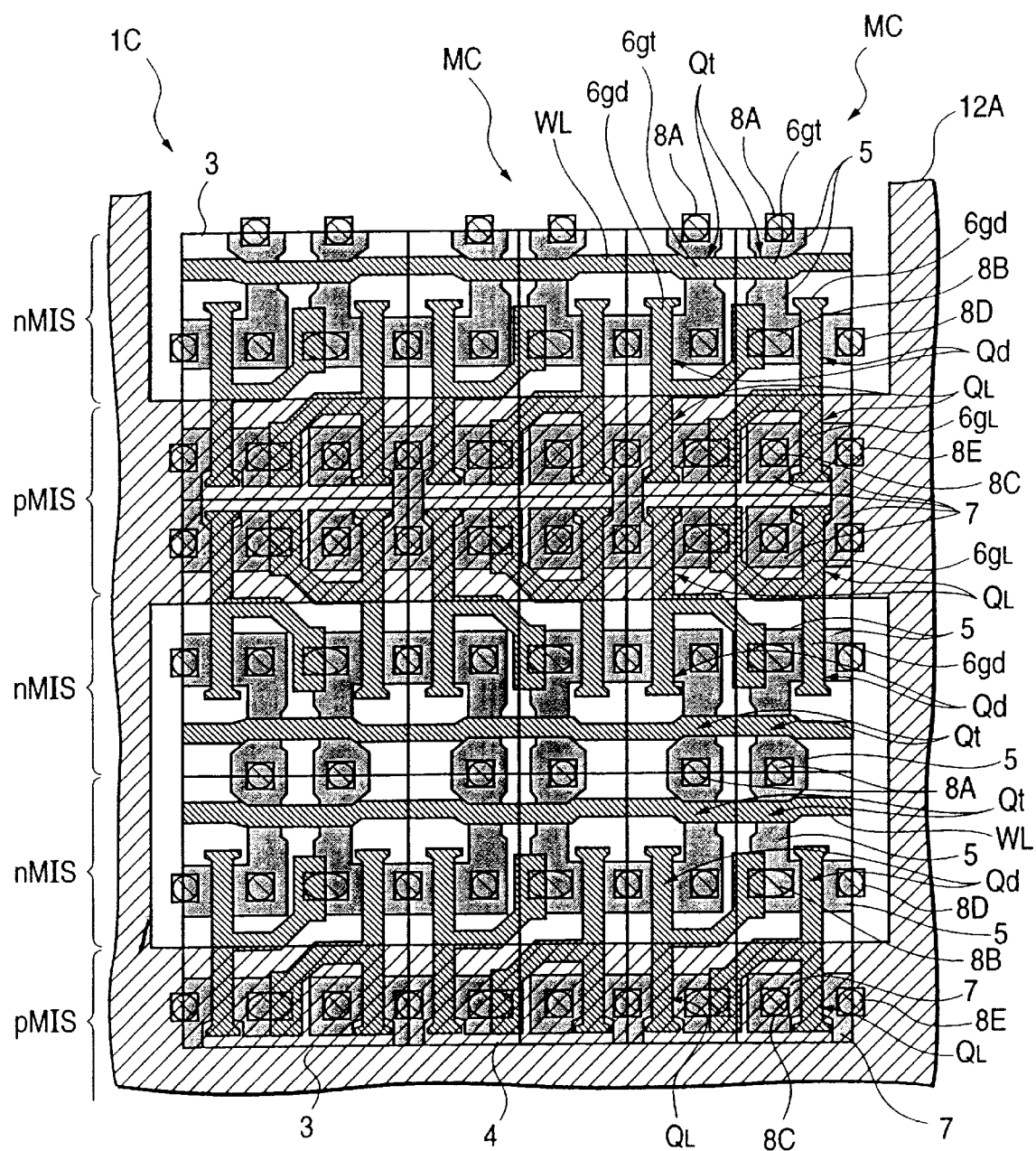
FIG. 6 is a plan view of a major part of the semiconductor integrated circuit device in FIG. 1 at a manufacturing step subsequent to that shown in FIG. 5.

The photoresist film for forming the isolation grooves is first removed and, in order to set the Vth of the driving MISFETs and transfer MISFETs relatively and intentionally higher, a photoresist pattern 12A is formed such that regions where the driving MISFETs Qd and transfer MISFETs Qt are to be formed are exposed on the semiconductor substrate 3 and such that regions other than them are covered as shown in FIG. 6. FIG. 6 shows the same memory cell region as in FIG. 3. Although elements and the like have not been formed yet at the stage shown in FIG. 6, they are shown here for better clarity of the position where the photoresist pattern 12A is formed. Further, the photoresist pattern 12A in FIG. 6 is hatched for better clarity of the drawing. The pattern configuration of the photoresist pattern 12A is not limited to that shown here; and, for example, the pattern may be formed into a configuration which exposes the regions to form the driving MISFETs Qd and transfer MISFETs Qt and also exposes the regions of n-channel type MISFETs formed on the semiconductor substrate 3, especially regions to form MISFETs for which any leakage current between the source and drain must be suppressed, and which covers other regions.

Subsequently, for example, boron difluoride (BF2) ions are implanted into the semiconductor substrate 3 using the photoresist pattern 12A as a mask. This is carried out under conditions as described below, although they are not a limiting aspect of the invention. Specifically, the ion implantation energy is about 40 keV; the dose is about $1 \times 10^{12}/$CM$^2$; and ion implantation angle is about 10 degrees. The ions are implanted at an angle in order to increase the Vth of the active region as a whole by introducing the impurity ions into the sides of the isolation grooves 4a. The ion implantation angle is the angle at which the impurity ions impinge upon the principle surface of the semiconductor substrate 3.

Figure 7:
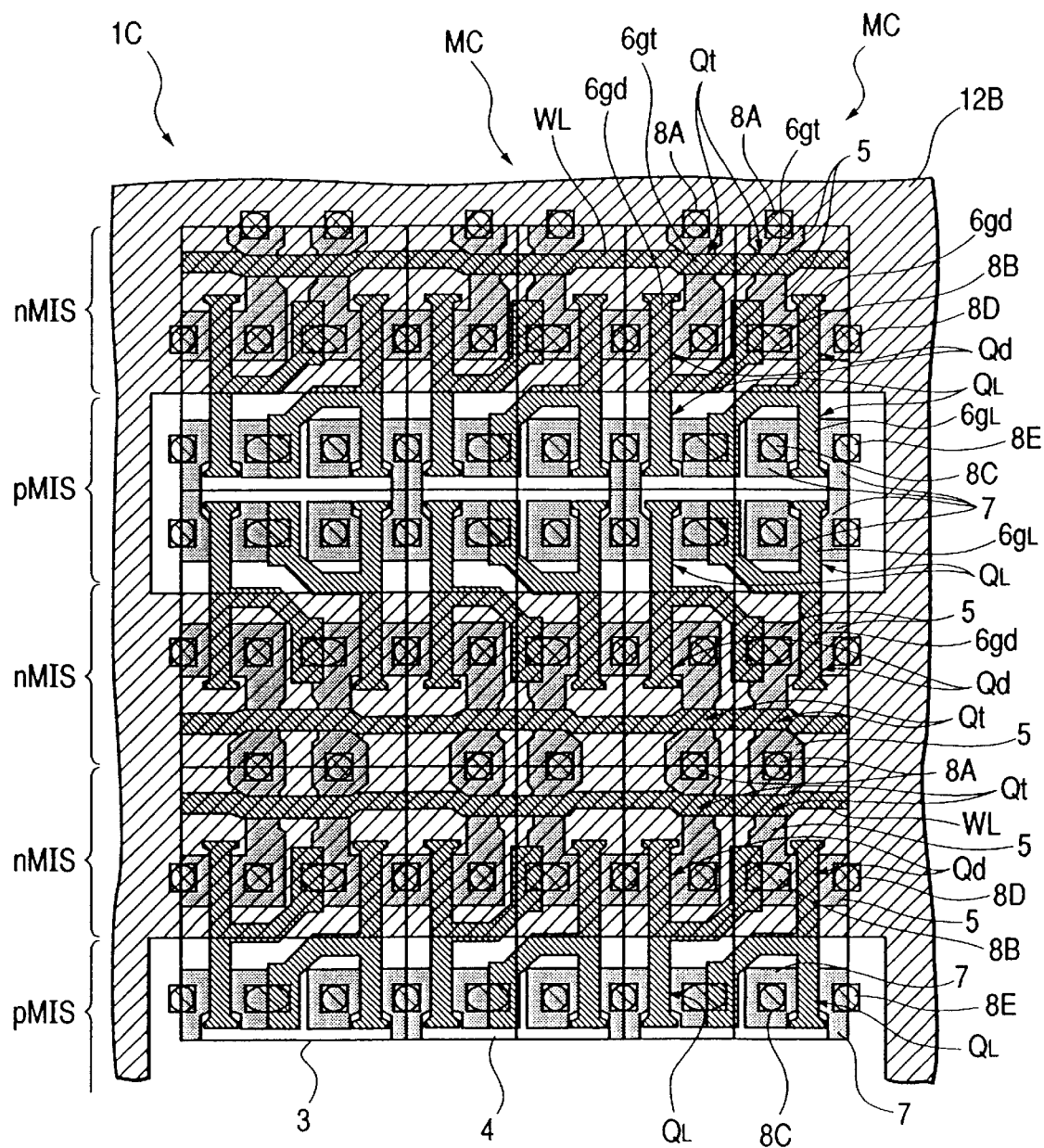
FIG. 7 is a sectional view of a major part of the memory cell region of the SRAM of the semiconductor integrated circuit device in FIG. 1 at a manufacturing step subsequent to that shown in FIG. 6.

Next, after removing the photoresist pattern 12A, a photoresist pattern 12B is formed which exposes the regions to form the MISFETs for load resistance QL on the semiconductor substrate 3—as shown in FIG. 7 in order to relatively and intentionally increase the Vth of the MISFETs for load resistance QL, and which covers other regions. FIG. 7 also shows the same memory cell region as in FIG. 3. Although elements and the like have not been formed yet at this stage, they are shown here to clearly show the position where the photoresist pattern 12B is formed. Further, the photoresist pattern 12B in FIG. 7 is also hatched for better clarity of the drawing. The pattern configuration of the photoresist pattern 12B is not limited to that shown here and, for example, the pattern may be formed into a configuration which exposes the regions to form the MISFETS for load resistance QL and also exposes the regions of p-channel type MISFETs formed on the semiconductor substrate 3, especially regions to form MISFETs for which any leakage current between the source and drain must be suppressed, and which covers other regions.

Subsequently, for example, phosphorus (P) ions are implanted into the semiconductor substrate 3 using the photoresist pattern 12B as a mask. This may be carried out under the same conditions as for the introduction of the impurity to relatively and intentionally increase the Vth of the driving MISFETs Qd as described above, although this is not a limiting aspect of the invention. Thereafter, the photoresist pattern 12B is removed.

The order of the process of introducing an impurity to increase the Vth of the driving MISFETs Qd and the like as described above and the process of introducing an impurity to increase the Vth of the MISFETs for load resistance QL may be reversed. The Vths of the driving MISFETs Qd, transfer MISFETs Qt and MISFETs for load resistance QL are relatively and intentionally increased by performing such a series of processes.

Figure 8:
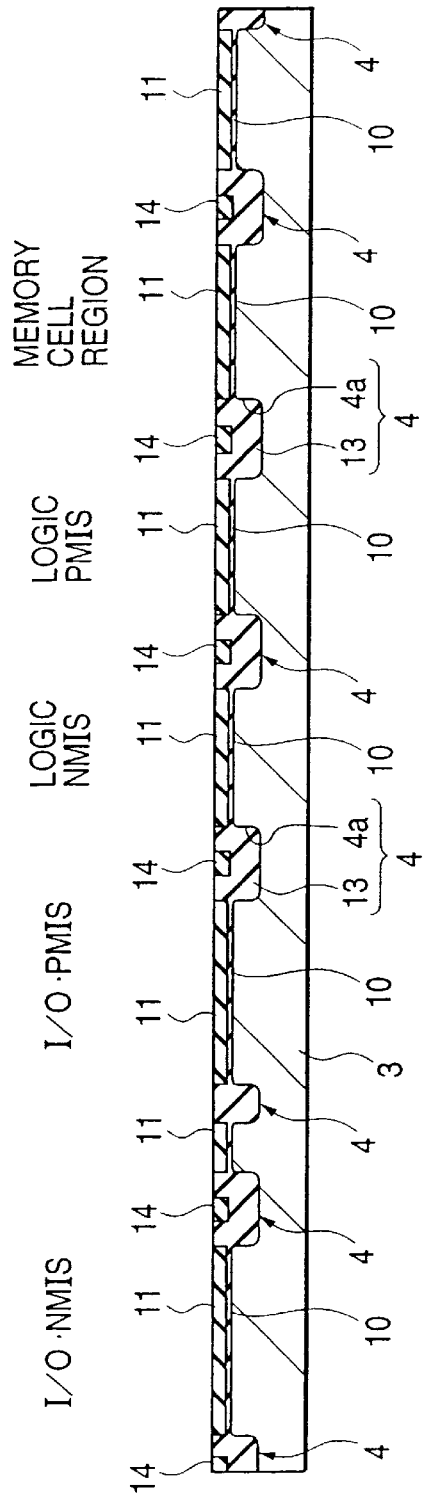
FIG. 8 is a sectional view of a major part of the semiconductor integrated circuit device in FIG. 1 at a manufacturing step subsequent to that shown in FIG. 7.

After such a first process, in order to remove any damaged layer produced on the inner walls of the isolation grooves 4a as a result of said etching, the semiconductor substrate 3 is subjected to dry oxidation at about 1000° C. to form thin silicon oxide films having a thickness of about 30 nm on the inner walls of the isolation grooves 4a. Subsequently, as shown in FIG. 8, a silicon oxide film 13 having a thickness of about 400 nm on the semiconductor substrate 3 is deposited and, thereafter, the semiconductor substrate 3 is subjected to wet oxidation to perform sintering (vitrification) for improving the quality of the silicon oxide films 13 embedded in the isolation grooves 4a. For example, the silicon oxide film 13 is deposited using a plasma CVD process that utilizes ozone ($O_3$) and tetraethoxysilane (TEOS) as source gases.

Next, a CVD process is performed to deposit a silicon nitride film having a thickness of about 200 nm on the silicon oxide films 13, and the silicon nitride film is thereafter subjected to dry etching using a photoresist film as a mask to leave silicon nitride films 14 only on isolation grooves 4a having relatively large areas, e.g., boundaries between the memory array and the peripheral circuits. The silicon nitride films 14 left on the isolation grooves 4a are formed in order to prevent a phenomenon (dishing) that occurs when the silicon oxide films 13 in isolation grooves 4a having relatively large areas are polished to a greater depth than the silicon oxide films 13 in isolation grooves having relatively smaller areas as the silicon oxide films 13 are polished and planarized using a chemical mechanical polishing (CMP) process at the next step.

Subsequently, after the photoresist film for patterning the silicon nitride films 14 is removed, a CMP process is carried out using the silicon nitride films 11, 14 as stoppers to polish and leave the silicon oxide films 13 in the isolation grooves 4a, thereby forming the isolation portions 4. While a reduction in the Vth of the MISFETs forming memory cells attributable to reverse narrow channel characteristics should normally be inevitable because a groove type isolating structure is employed as a structure for the isolation portions 4, this mode for carrying out the invention is free from such a problem because it involves said first process or a process to be described later for relatively and intentionally increasing the Vth of the MISFETs forming the memory cells.

Figure 9:
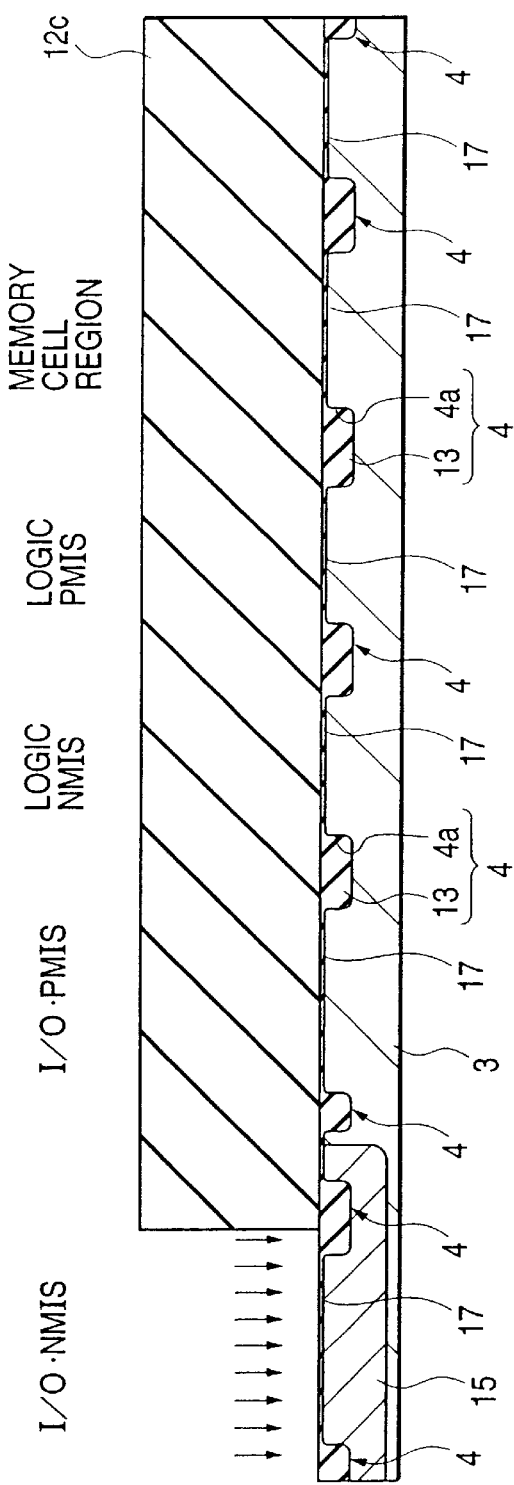
FIG. 9 is a sectional view of a major part of the semiconductor integrated circuit device in FIG. 1 at a manufacturing step subsequent to that shown in FIG. 8.

Thereafter, the silicon nitride films 11, 14 are removed, and a pre-oxidation process is carried out on the semiconductor substrate 3 to form a gate insulation film having a thickness of about 10 nm on the semiconductor substrate 3. Then, as shown in FIG. 9, a photoresist pattern 12C is formed which exposes the buried regions on the principle surface of the semiconductor substrate 3 and covers other regions; and, for example, phosphorus ions are implanted into the semiconductor substrate 3 using the photoresist pattern 12C as a mask to form an n-type buried region 15 on the semiconductor substrate 3. While the n-type buried region 15 has not been formed yet at this stage because a thermal process for the activation of the impurity and the like has not been performed on the semiconductor substrate 3, the region is illustrated here for clarity of the description.

Next, after removing the photoresist pattern 12C, a photoresist pattern is formed which exposes n-well regions throughout the principle surface of the semiconductor substrate 3 and covers other regions.

Subsequently, for example, phosphorus ions are implanted into the semiconductor substrate 3 using the photoresist pattern as a mask. Two kinds of impurity introduction steps are separately performed here which are a step of introducing said impurity for forming at least n-wells 16NW and a step of introducing said impurity for setting the Vth of MISFETs formed in n-wells 16NW in regions other than the memory cell region. Thereafter, the photoresist pattern is removed.

Next, as shown in FIG. 10, a photoresist pattern 12D is formed which exposes p-well regions throughout the principle surface of the semiconductor substrate 3 and covers other regions. Subsequently, for example, boron or boron difluoride ions are implanted into the semiconductor substrate 3 using the photoresist pattern 12D as a mask. Two kinds of impurity introduction steps are separately performed here which are a step of introducing said impurity for forming at least p-wells 16PW and a step of introducing said impurity for setting the Vth of MISFETs formed in p-wells 16PW in regions other than the memory cell region. Thereafter, the photoresist pattern 12D is removed.

After said step of introducing the impurity for wells and the like, a process (hereinafter referred to as a "second process") as described below may be performed instead of the above-described first process to relatively and intentionally increase the Vth of said driving MISFETS, transfer MISFETs and MISFETs for load resistance beyond the Vth of predetermined MISFETs of the SRAM peripheral circuits and logic circuits.

First, in order to set the Vth of the driving MISFETs and transfer MISFETs relatively and intentionally higher, said photoresist pattern 12A is formed as shown in FIG. 6 (or a photoresist pattern as a modification thereof). Although elements and the like have not been formed yet also at this stage, they are shown here for better clarity of the position where the photoresist pattern 12A is formed.

Subsequently, for example, boron difluoride ($BF_2$) ions are implanted into the semiconductor substrate 3 using the photoresist pattern 12A as a mask. This is carried out under conditions as described below, although they are not a limiting aspect of the invention. Specifically, the ion implantation energy is about 60 keV; the dose is about $3 \times 10^{12}/cm^2$; and the ion implantation angle is about 90 degrees (i.e., perpendicular to the principle surface of the semiconductor substrate 3).

Next, after removing the photoresist pattern 12A, said photoresist pattern 12B shown in FIG. 7 (or a modification of the same) is formed in order to relatively and intentionally increase the Vth of the 10 MISFETs for load resistance QL. Although elements and the like have not been formed yet also at this stage, they are shown here to clearly show the position where the photoresist pattern 12B is formed.

Subsequently, for example, phosphorus (P) ions are implanted into the semiconductor substrate 3 using the photoresist pattern 12B as a mask. The conditions may be the same as said conditions for the introduction of the impurity to relatively and intentionally increase the Vth of the driving MISFETs Qt and the like in the second process except that the ion implantation energy is, for example, about 40 keV, although this is not limiting the invention.

The order of the process of introducing an impurity to increase the Vth of the driving MISFETs Qd and the like as described above and the process of introducing an impurity to increase the Vth of the MISFETS for load resistance QL may be reversed also in this case.

The Vths of the driving MISFETs Qd, transfer MISFETs Qt and MISFETs for load resistance QL are relatively and intentionally increased by performing such a series of processes.

After such a second process, a thermal process is performed on the semiconductor substrate 3 to carry out the activation of the impurity introduced into the semiconductor substrate 3 and the like, thereby forming the n-wells 16NW, p-wells 16PW and n-type buried region 15 on the semiconductor substrate 3.

The process then proceeds to the step of forming the gate insulation film and, in this mode for carrying out the invention, the step of forming the gate insulation film may be preceded by a process as described below (hereinafter referred to as a "third process) which replaces the above-described first process or second process to relatively and intentionally increase the Vth of said driving MISFETS, transfer MISFETs and MISFETs for load resistance beyond the Vth of predetermined MISFETs of the SRAM:peripheral circuits and logic circuits.

First, a photoresist pattern is formed which exposes regions to form MISFETs whose operating speed must be increased in the regions of the peripheral circuits and logic circuits and which covers regions to form MISFETs for which any leakage current between the source and drain must be suppressed throughout the memory cell region and in the regions of the peripheral-circuits and logic circuits.

Subsequently, for example, nitrogen (N) ions are implanted into the-semiconductor substrate 3 using the photoresist pattern as a mask. This is carried out under conditions as described below, although they are not a limiting aspect of the invention. Specifically, the ion implantation energy is about 5 keV; the dose is about $4 \times 10^{12}/cm^2$; and the ion implantation angle is about 90 degrees.

It is thus possible to set the Vth of the driving MISFETS, transfer MISFETs and MISFETs for load resistance in the memory cell region relatively and intentionally higher. The reason for this is as follows. Specifically, the Vth of a MISFET decreases when nitrogen is included in the gate insulation film thereof Further, in a region doped with nitrogen, the gate insulation film is nitrised to have increased anti-oxidation properties and therefore becomes thinner than the gate insulation film in a region which is not doped with nitrogen. The Vth of a MISFET whose gate insulation film is formed in a region doped with nitrogen can be made relatively smaller than the Vth of a MISFET whose gate insulation film is formed in a region which is not doped also in this aspect.

Since nitrogen is segregated on the interface between the gate insulation film and the semiconductor substrate 3 in a region doped with nitrogen, an advantage can be obtained in that the reliability of the gate insulation film can be improved. It is known that a reduction in the thickness of a gate insulation film causes a distortion of the interface between the gate insulation film and the semiconductor substrate 3 attributable to the difference between the thermal expansion coefficients of the film itself and the semiconductor substrate 3 to induce the generation of hot carriers. The reason for this is that such a distortion is moderated by the nitrogen segregated on the interface to the semiconductor substrate 3. Since the problem of hot carriers is unlikely to occur in a memory cell region, no particular problem occurs even if a memory cell region is not doped with nitrogen.

While the present mode for carrying out the invention has referred to a case wherein said third process is carried out instead of said first process or second process, this is not a limiting aspect of the invention and the third process may be carried out in combination with the first process or second process.

After such a third process, the process proceeds to, for example, a step of forming gate insulation films, as will be described below.

First, an oxidation process for forming the gate insulation films of MISFETs having a high withstand voltage formed on the semiconductor substrate 3 is performed to form gate insulation films having the maximum relative thickness of, for example, 9 nm or more on the principle surface of the semiconductor substrate 3. Subsequently, a photoresist pattern is formed on the gate insulation film to cover the region to form the MISFETs having a high withstand voltage and to expose other regions; and, thereafter, the thick gate insulation film exposed from the photoresist pattern is removed and the photoresist pattern is reduced further.

While the process normally proceeds thereafter to a step of forming the gate insulation films of MISFETs other than the MISFETs having a high withstand voltage, according to the present mode for carrying out the invention, a process as described below (hereinafter referred to as a "fourth process") may be performed in addition to said first process, second process or third process in order to set the Vth of said driving MISFETS, transfer MISFETs and MISFETs for load resistance relatively and intentionally higher than the Vth of predetermined MISFETs of the SRAM peripheral circuits and logic circuits.

First, an oxidation process for forming the gate insulation films of MISFETs forming memory cells and MISFETs for which any leakage current between the source and drain must be suppressed is carried out to form gate insulation films having an intermediate relative thickness of, for example, about 5 nm on the principle surface of the semiconductor substrate 3. The thickness of the gate insulation films is made greater than the thickness of gate insulation films formed on regions to form MISFETs whose operating speed must be increased in the regions of peripheral circuits and logic circuits. This makes it possible to relatively and intentionally increase the Vth of the MISFETs forming memory cells and said MISFETs for which any leakage current must be suppressed.

Subsequently, a photoresist pattern is formed on the gate insulation films having an intermediate thickness to cover regions to form said MISFETs for which any leakage current must be suppressed in the entire memory cell region, peripheral circuit regions and logic circuit regions and to expose other regions; and, thereafter, the gate insulation films having an intermediate thickness exposed from the photoresist pattern are removed and the photoresist pattern is removed further.

Thereafter, an oxidation process for forming the gate insulation films of MISFETs which must operate at a high speed on the semiconductor substrate 3 is performed to form gate insulation films having the minimum relative thickness less than, for example, 5 nm on the principle surface of the semiconductor substrate 3.

Next, as shown in FIG. 11, a conductive film 18 for forming-gate electrodes is formed on the semiconductor substrate 3 using a CVD process or the like to cover gate insulation films 17 formed as described above and the upper surface of the isolation portions 4. For example, the conductive film 18 is constituted by a single film made of low resistance polysilicon, a multi-layer film formed by coating low resistance polysilicon with a tungsten silicide film or a multi-layer film formed by coating low resistance polysilicon with a metal film such as tungsten with a barrier metal film such as tungsten nitride or titanium nitride interposed therebetween. Said barrier metal film functions as a barrier layer for preventing the tungsten film and polysilicon film from reacting to each other during a high temperature thermal process to form a high resistance suicide layer at the interface between them.

Subsequently, a photoresist pattern 12E is formed on the conductive film 18 to expose regions to form n-channel type MISFETs in the memory cell region and other regions and to cover other regions, and, for example, phosphorus ions are implanted into the conductive film 18 using it as a mask. Thereafter, after removing the photoresist pattern 12E, a capping insulation film made of, for example, silicon oxide or silicon nitride is deposited on the conductive film 18 using a CVD process or the like.

Next, after patterning the capping insulation film with-a photoresist pattern as a mask using a dry etching process or the like, the photoresist pattern is removed; the conductive film 18 is patterned using the patterned capping insulation film as a mask; and the capping insulation film 19 is removed further to form gate electrodes 6g as shown in FIG. 12. The capping insulation film and the conductive film 18 are patterned at one time using a photolithographic technique and a dry etching technique to form the gate electrodes 6g (6gd, 6gL) and the capping insulation film. In this case, the capping insulation film is left on the gate electrodes 6g. The minimum gate length for the gate electrodes 6g is set at a minimum dimension (for example, 0.24µ) within a tolerance in which the short channel effect of MISFETs can be suppressed to maintain the Vth of the same at a predetermined value or more.

Next, for example, phosphorus (P) ions are implanted into the p-wells 16PW using a photoresist pattern as a mask as shown in FIG. 13 to form n⁻-type semiconductor regions 5a in the p-wells 16PW on both sides of the gate electrodes 6g. While the n⁻-type semiconductor regions 5a are not formed at this stage because no thermal process for activation and the like has been performed, they are shown here for better understanding of the description.

Subsequently, after removing the photoresist pattern, for example, boron (B) ions are implanted into the n-wells 16NW using a newly formed photoresist pattern 12F as a mask to form p⁻-type semiconductor regions 7a in the n-wells 16NW on both sides of the gate electrodes 6g. While the p⁻-type semiconductor regions 7a are not formed at this stage because no thermal process for activation and the like has been performed, they are shown here for better understanding of the description.

Figure 14:
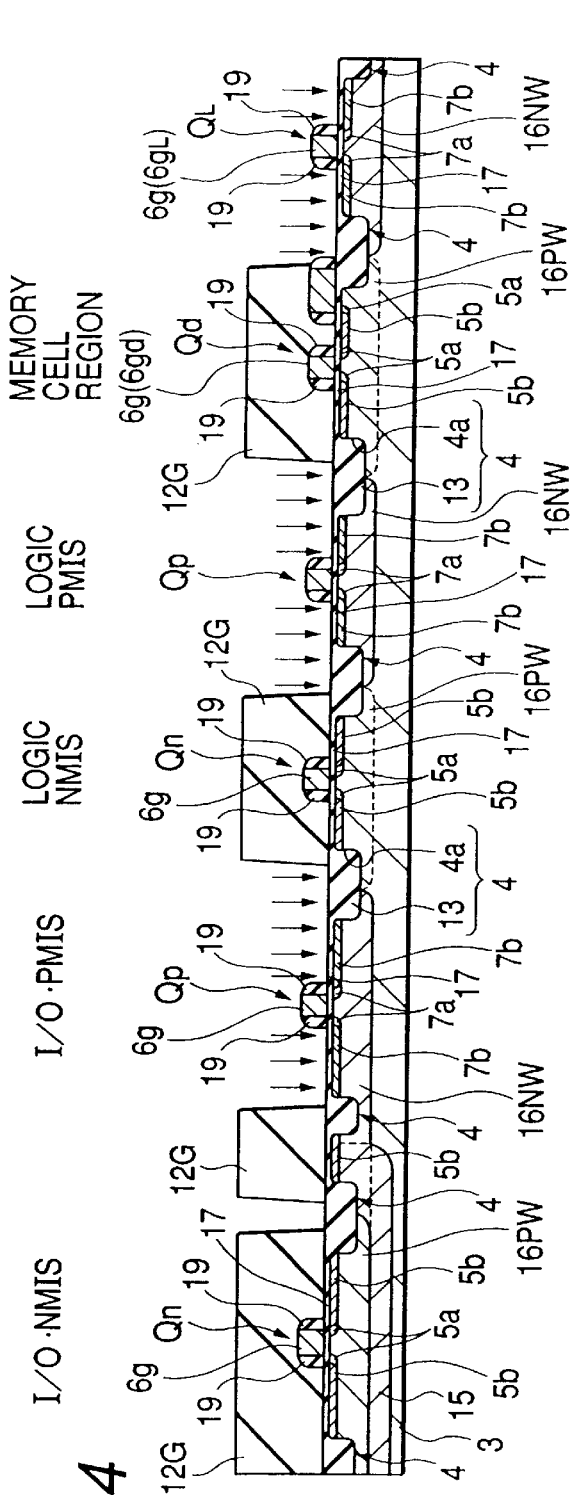
FIG. 14 is a sectional view of a major part of the semiconductor integrated circuit device in FIG. 1 at a manufacturing step subsequent to that shown in FIG. 13.

Next, after removing the photoresist pattern 12F, a thermal process is carried out for the activation of the impurities introduced into the semiconductor substrate 3; as shown in FIG. 14, a silicon nitride film having a thickness of about 50 nm is deposited thereafter on the semiconductor substrate 3 using a CVD process or the like; and the silicon nitride film is then subjected to anisotropic etching to form side walls spacers 19 on the side walls of the gate electrodes 6g. This etching is carried out using an etching gas that promotes the etching of a silicon nitride film at a rate greater than that for a silicon oxide film in order to minimize the amount of removal of the gate insulation films 17 and the silicon oxide films buried in the isolation portions 4. When the capping insulation film constituted by a silicon nitride film is formed on the gate electrodes 6g, the amount of overetching is also limited to the required minimum in order to minimize the amount of removal of the same.

Next, for example, arsenic (A) ions are implanted into the p-wells 16PW using a photoresist pattern as a mask to form $n^+$-type semiconductor regions 5b of n-channel type MISFETS. While the $n^+$-type semiconductor regions 5b are not formed at this stage because no thermal process for activation and the like has been performed, they are shown here for better understanding of the description. The n-type semiconductor regions 5 shown in FIG. 3, for example, are constituted by the n-type semiconductor regions 5a and $n^+$-type semiconductor regions 5b.

Subsequently, after removing the photoresist pattern, for example, boron (B) ions are implanted into the n-wells 16NW using a newly formed photoresist pattern 12G as a mask to form $p^+$-type semiconductor regions 7b of p-channel type MISFETS. While the $p^+$-type semiconductor regions 7b are not formed at this stage because no thermal process for activation and the like has been performed, they are shown here for better understanding of the description. The p-type semiconductor regions 7 shown in FIG. 3, for example, are constituted by the $p^-$-type semiconductor regions 7a and $p^+$-type semiconductor regions 7b.

Next, after removing the photoresist pattern 12G, a thermal process is carried out for the activation of the impurities introduced into the semiconductor substrate 3 to form p-channel type MISFETs Qp, QL and n-channel type MISFETs Qn, Qd.

Figure 15:
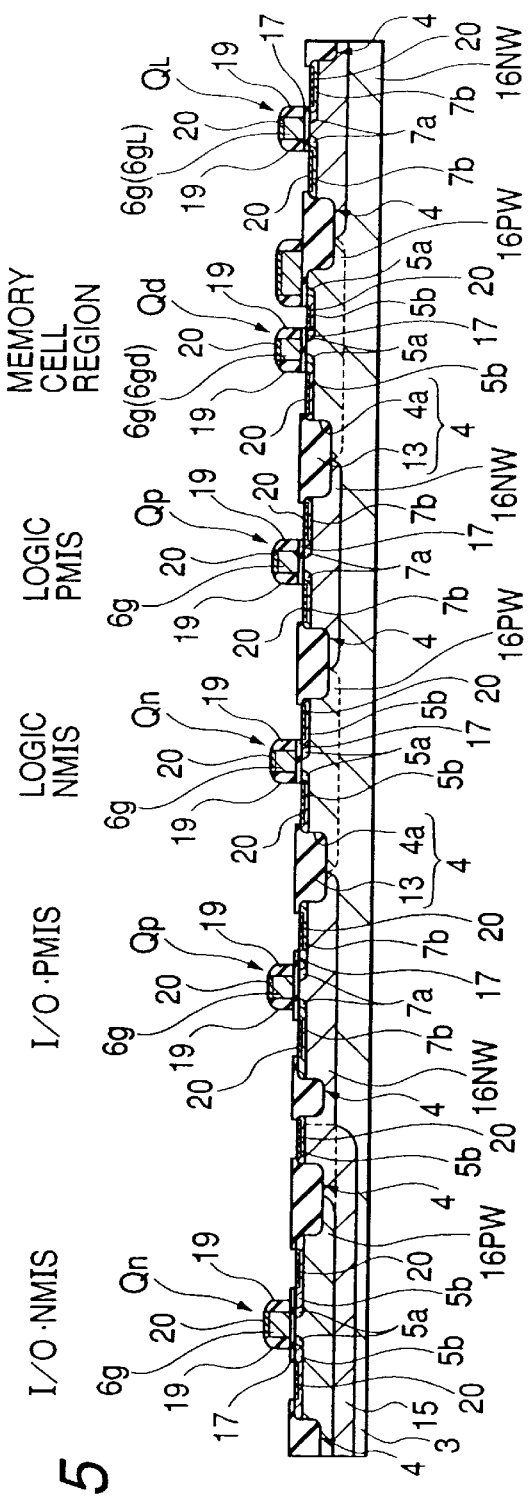
FIG. 15 is a sectional view of a major part of the semiconductor integrated circuit device in FIG. 1 at a manufacturing step subsequent to that shown in FIG. 14.
Figure 16:
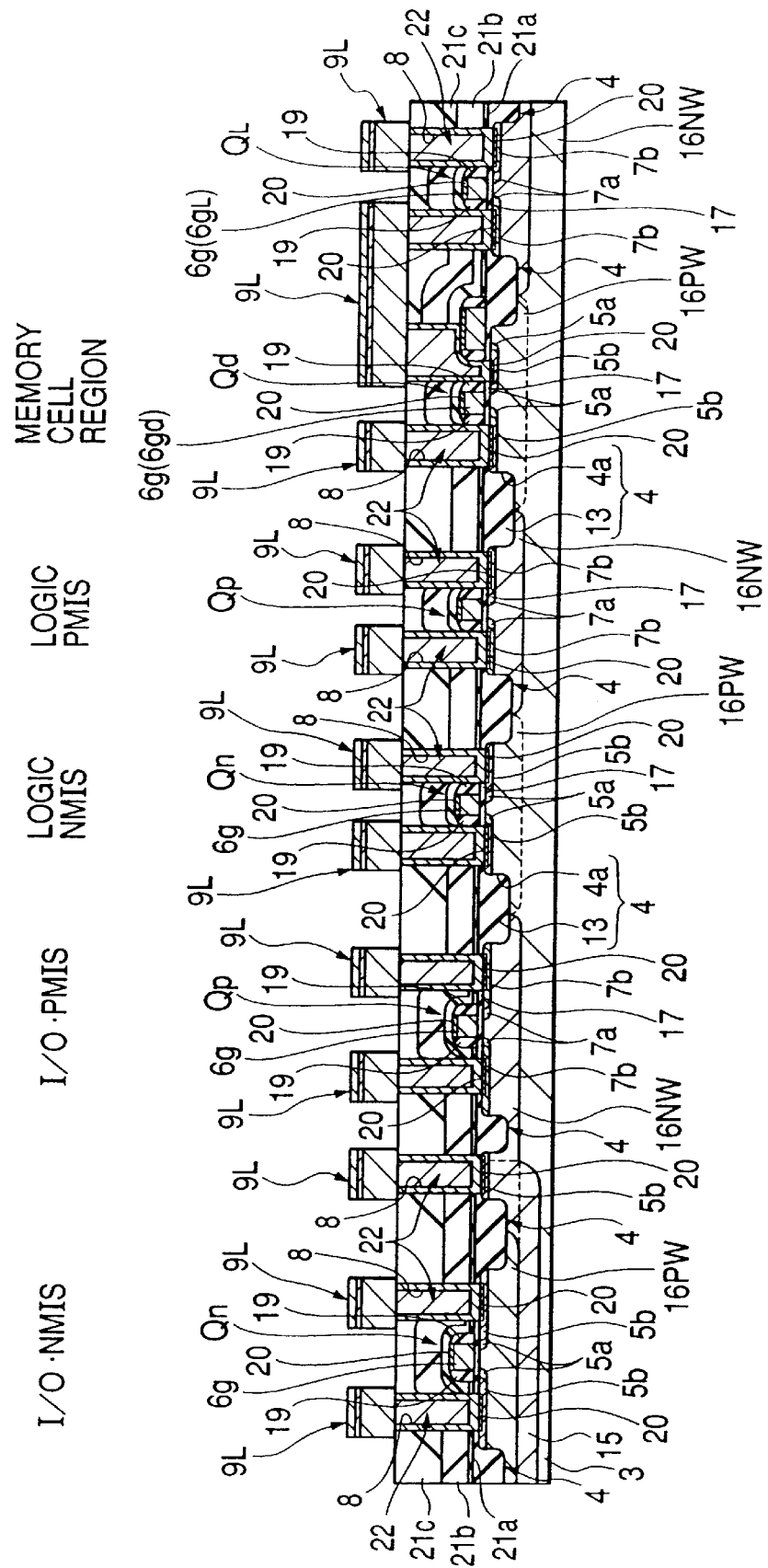
FIG. 16 is a sectional view of a major part of the semiconductor integrated circuit device in FIG. at a manufacturing step subsequent to that shown in FIG. 15.
Figure 17:
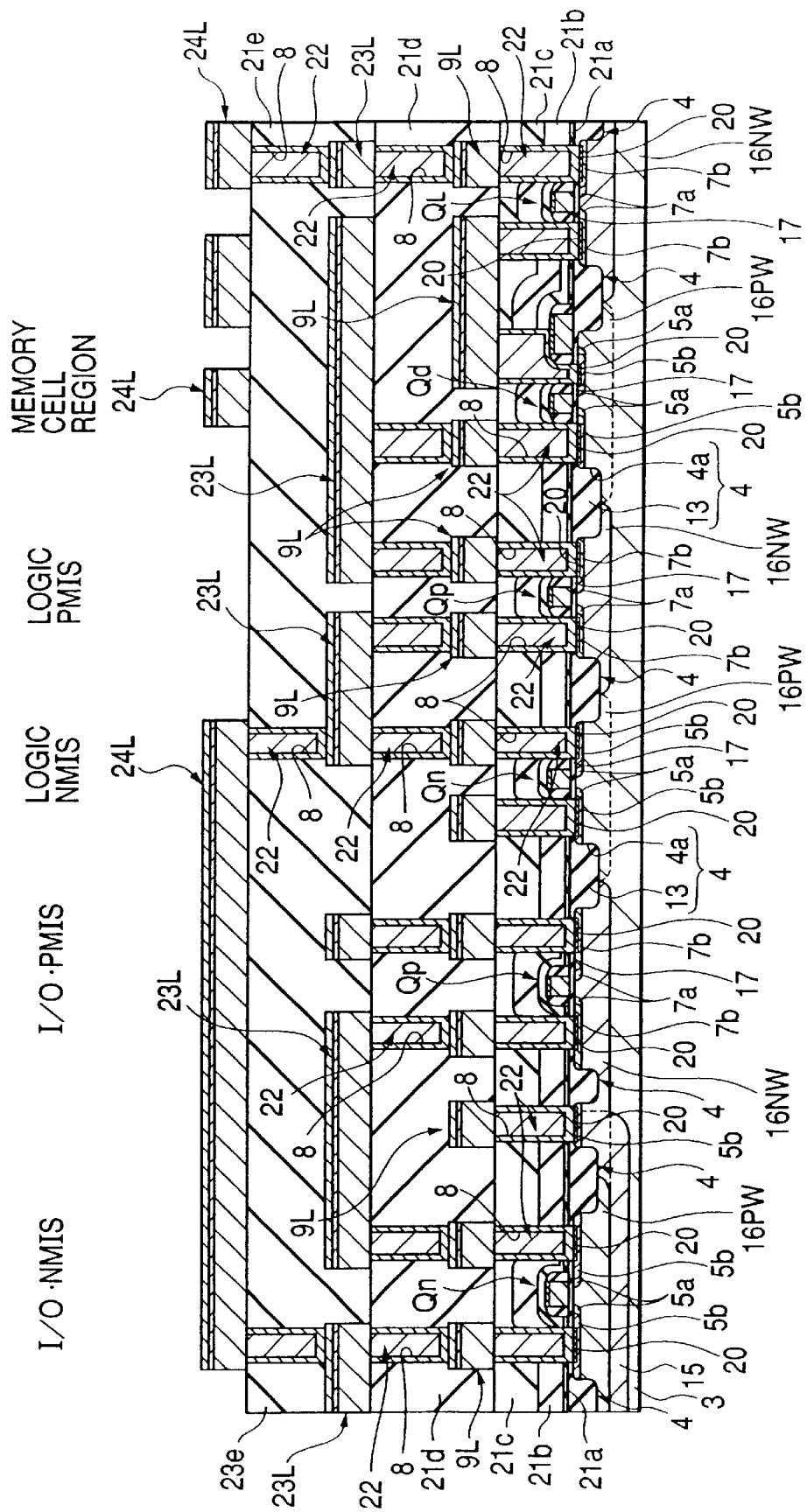
FIG. 17 is a sectional view of a major part of the semiconductor integrated circuit device in FIG. 1 at a manufacturing step subsequent to that shown in FIG. 16.

Next, a conductive film made of titanium nitride (TiN), cobalt (Co) or the like is deposited on the semiconductor substrate 3 using a sputtering process or the like, and a thermal process is performed thereafter to form a silicide layer 20 at the interface between the conductive film and the semiconductor substrate 3 and the gate electrodes 6g as shown in FIG. 15. Subsequently, a thermal process is performed again after removing the conductive film which has not been silicified.

Next, an insulation film 21a constituted by a silicon nitride film or the like is deposited on the semiconductor substrate 3 using a CVD process or the like; an insulation film 21b made of PSG (phosho silicate glass) is deposited thereon using a CVD process or the like; and an insulation film 21c made of, for example, silicon oxide is further deposited thereon. Subsequently, after planarizing the upper surface of the insulation film 21c using a CMP process, connection holes 8 are formed in a part of the insulation films 21a–21c. Thereafter, for example, titanium, titanium nitride and tungsten are deposited on the semiconductor substrate 3 in the older of precedence in stacking and are etched back thereafter using a CMP process to bury and form conductive films 22 in the connection holes 8.

Next, for example, titanium, aluminum or an aluminum alloy, titanium and titanium nitride are deposited on the semiconductor substrate 3 in the order of precedence in stacking and are thereafter patterned using a photolithographic technique and a dry etching technique to form first layer wiring 9L. Subsequently, second layer wiring 23L and third layer wiring 24L are formed similarly to said first layer wiring 9L. Reference numbers 21d, 21e represent, for example, insulation films made of silicon oxide. A normal method of manufacturing a semiconductor integrated circuit device is hereafter used to manufacturers microprocessor incorporating an SRAM for a cache memory.

The effects of the present mode for carrying out the invention will now be described with reference to FIGS. 18 through 20.

FIG. 18 shows a transfer curve in a case wherein the Vth of MISFETs forming memory cells is relatively and intentionally increased as in the present mode for carrying out the invention, and FIG. 19 shows a transfer curve in a case wherein the Vth is not increased. FIG. 20 shows an SNM for the Vth of driving MISFETS.

As apparent from a comparison between the transfer curves in FIGS. 18 and 19, the present mode for carrying out the invention makes it possible to improve an SNM significantly. Especially, as apparent from FIGS. 18 through 20, when the first process or second process is performed to increase the Vth of driving MISFETS, the SNM is abruptly increased and a sufficient operational margin can be maintained for the memory cells.

Thus, the following effects can be achieved by the mode 1 for carrying out the invention.

(1) In a microprocessor incorporating an SRAM, since the Vth of driving MISFETS, transfer MOSFETs and MISFETs for load resistance for memory cells of the SPAM is relatively and intentionally increased, the SNM of the SRAM can be improved while improving the operating speed of the microprocessor, reducing the power supply voltage (i.e., reducing the power consumption) and improving the degree of element integration as a result of the use of a groove type isolation structure.

(2) It is possible to reduce the rate of occurrence of read faults and write faults of the memory in the microprocessor incorporating an-SRAM.

(3) According to the above effects (1), (2), it is possible to improve the reliability of the operation of a microprocessor incorporating an SRAM which is compact, which has high performance and which can operate at a high speed with a small power consumption.

Embodiment 2

Figure 21:
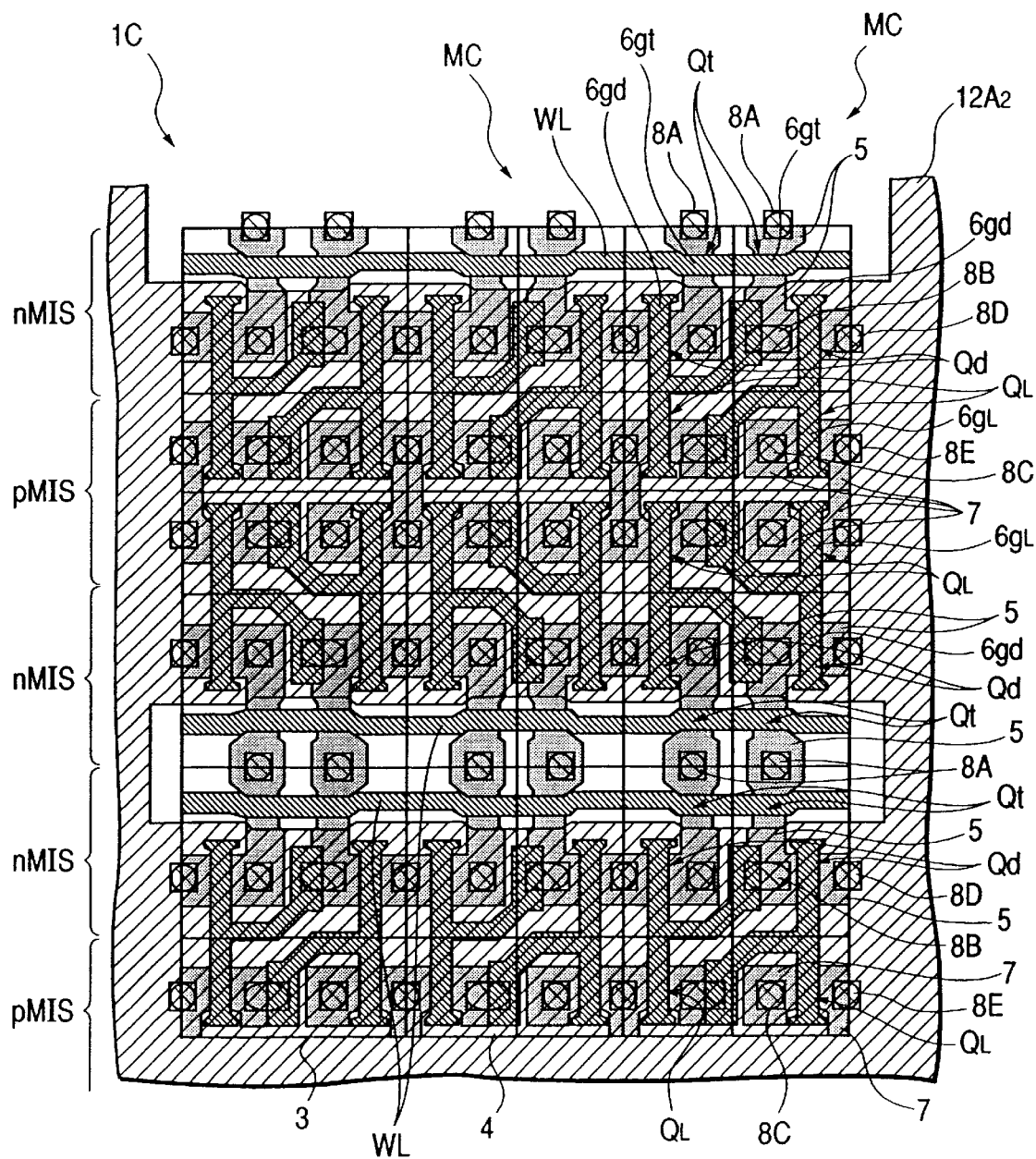
FIG. 21 is a plan view of A major part of memory cells of an SRAM of a semiconductor integrated circuit device, which is another mode for carrying out the invention at a manufacturing step of the same.

FIG. 21 is a plan view of major parts of a semiconductor integrated circuit device which represents another mode for carrying out the invention taken during the manufacture of the same.

While the mode 1 for carrying out the invention involves a case in which the Vth of all MISFETs that form memory cells of an SRAM is relatively and intentionally increased, the invention is not limited thereto, and the Vth of predetermined MISFETs of the memory cells of the SRAM may be relatively and intentionally increased.

The mode 2 for Carrying out the invention describes it and, for example, in order to increase the Vth of transfer MISFETS relatively and intentionally, a photoresist pattern 12A2 may be formed on the semiconductor substrate 3 as shown in FIG. 21 instead of the photoresist pattern 12A shown in FIG. 6 at said first process or second process described in said mode 1 for carrying out the invention, such that regions to form the transfer MISFETs are exposed and other regions are covered. FIG. 21 shows the same memory cell region as in FIGS. 3, 6 and others and shows elements and the like for clearly showing the position where the photoresist pattern 12A2 is formed as in the above description. The photoresist pattern 12A2 is also hatched in FIG. 21 for better clarity of the figure. Further, the configuration of the photoresist pattern 12A2 is not limiting aspect of the present invention; and, for example, the pattern may be formed in a configuration which exposes regions to form the transfer MISFETs Qt and regions to form n-channel type MISFETs formed in the semiconductor substrate 3, especially regions to form MISFETs for which any leakage current between the source and drain must be suppressed and which covers other regions.

According to such a mode 2 for carrying out the invention, especially, it is possible to reduce the rate of occurrence of read faults of a memory while improving the operating speed of a microprocessor incorporating an SRAM, reducing the power supply voltage (i.e., reducing the power consumption) and improving the degree of element integration. It is therefore possible to improve the reliability of the operation of a microprocessor incorporating an SRAM which is compact, which has high performance and which a can operate at a high speed with small power consumption.

Embodiment 3

Figure 22:
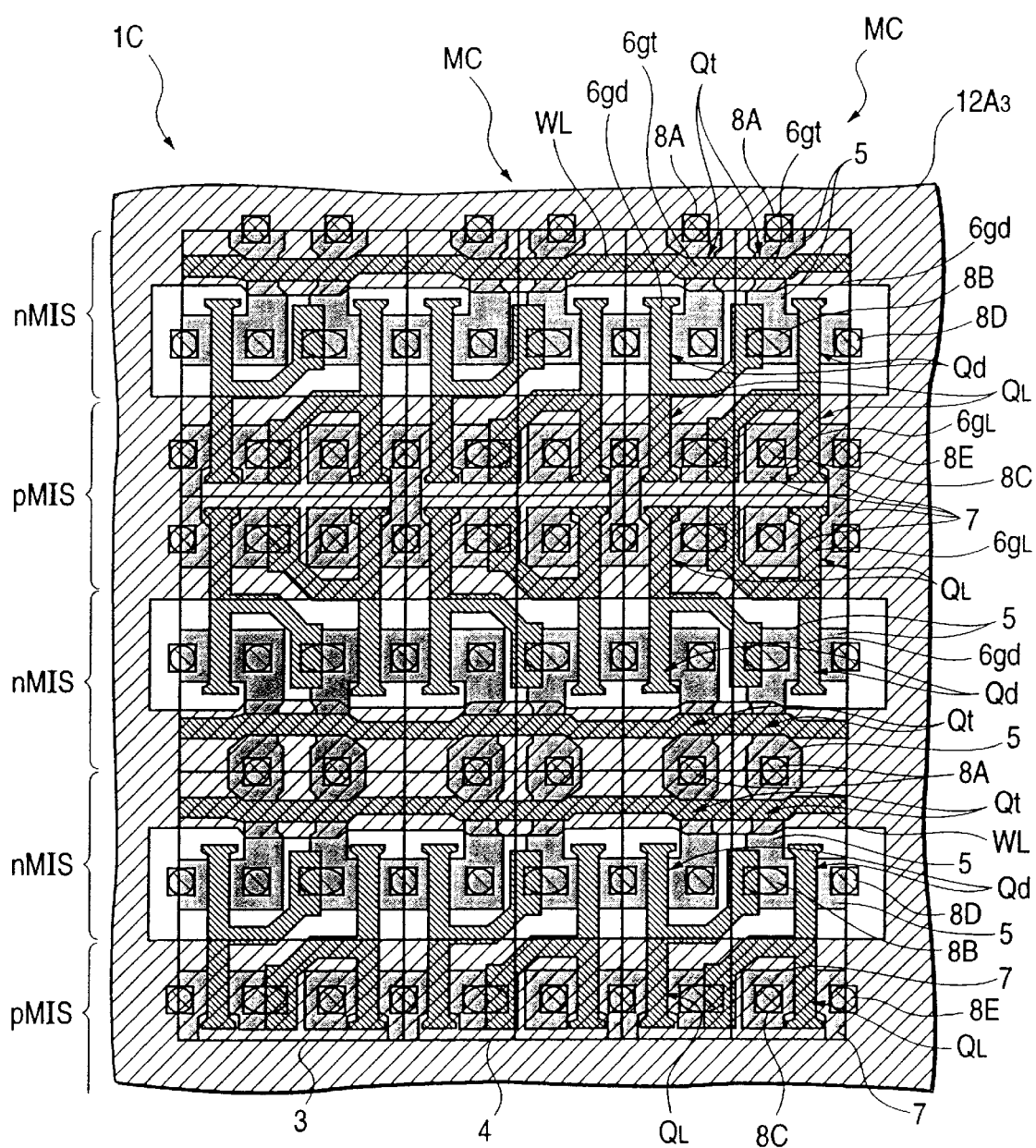
FIG. 22 is a plan view of a major part of memory cells of an SRAM of a semiconductor integrated circuit device, which represents still another mode for carrying out the invention at a manufacturing step of the same.

FIG. 22 is a plan view of major parts of a semiconductor integrated circuit device which represents another mode for carrying out the invention taken during the manufacture of the same.

The mode 3 for carrying out the invention involves a case wherein the Vth of driving MISFETs is to be relatively and intentionally increased. In this case, a photoresist pattern 12A3 may be formed on the semiconductor substrate 3, as shown in FIG. 22, instead of the photoresist pattern 12A (see FIG. 6) at said first process or second process described in said mode 1 for carrying out the invention, such that regions to form the driving MISFETs are exposed and other regions are covered. FIG. 22 also shows the same memory cell region as in FIGS. 3, 6 and others and shows elements and the like for clearly showing the position where the photoresist pattern 12A3 is formed h in the above description. The photoresist pattern 12A3 is also hatched in FIG. 22 for better clarity of the figure. Further, the configuration of the photoresist pattern 12A3 is not a limiting aspect of the present invention; and, for example, the pattern may be formed in a configuration which exposes regions to form the driving MISFETs Qd and regions to form n-channel type MISFETs formed in the semiconductor substrate 3, especially regions to form MISFETs for which any leakage current between the source and drain must be suppressed, and which covers other regions.

According to such a mode 3 for carrying out the invention, especially, it is possible to improve the SNM of an SRAM while improving the operating speed of a microprocessor incorporating an SRAM, reducing the power supply voltage (i.e., reducing the power consumption) and improving the degree of element integration. It is therefore possible to improve the reliability of the operation of a microprocessor incorporating an SRAM which can operate at a high speed with small power consumption.

Embodiment 4

Figure 23:
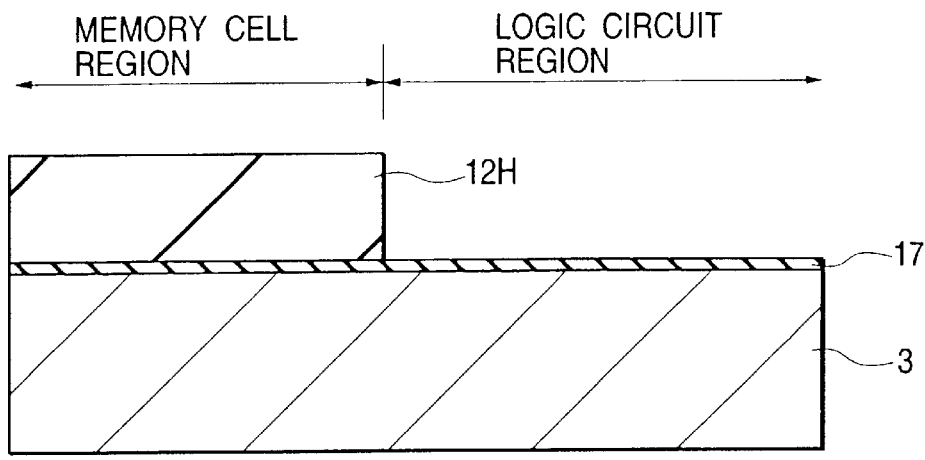
FIG. 23 is a sectional view of a major part of a semiconductor integrated circuit device which is another mode for carrying out the invention at a manufacturing step of the same.
Figure 24:
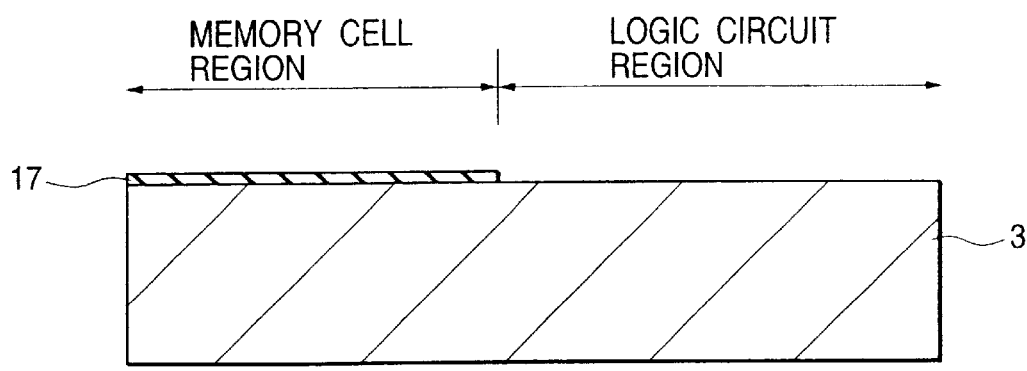
FIG. 24 is a sectional view of a major part of the semiconductor integrated circuit device at a manufacturing step subsequent to that shown in FIG. 23.
Figure 25:
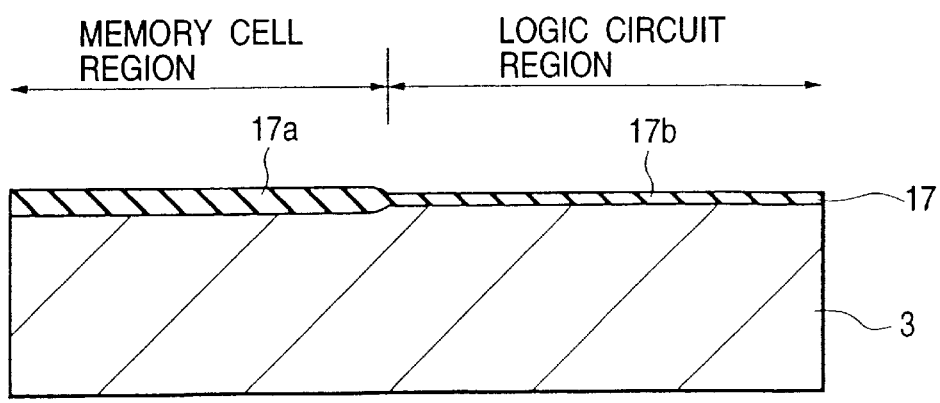
FIG. 25 is a sectional view of a major part of the semiconductor integrated circuit device at a manufacturing step subsequent to that shown in FIG. 24.

FIGS. 23 through 25 are plan views of major parts of a semiconductor integrated circuit device which represents another mode for carrying out the invention taken during the manufacture of the same.

The mode 4 for carrying out the invention describes a modification of the third process described in said mode 1 for carrying out the invention. Specifically, while said third process involves a case wherein nitrogen is introduced into a semiconductor substrate using ion implantation, nitrogen is segregated on the interface between gate insulation films and a semiconductor substrate by mixing nitrogen gas in the atmosphere of a thermal process in the mode 4 for carrying out the invention, and the specific method for the same is as follows.

First, as shown in FIG. 23, gate insulation films 17 made of, for example, silicon oxide are formed on the principle surface of a semiconductor substrate 3 using a normal gate oxidation process; a photoresist pattern 12H is formed on the principle surface of the semiconductor substrate 3 to cover the memory cell region and to expose other regions; and the gate insulation films 17 exposed therefrom are removed using it as an etching mask.

The photoresist pattern 12H is then removed to leave the gate insulation films 17 only in the memory cell region as shown in FIG. 24. Thereafter, a gate oxidation process is performed on the semiconductor substrate 3, for example, in an NO (nitrogen oxide) or $N_2O$ (nitrogen monoxide) atmosphere to form the gate insulation films 17 (17a, 17b) as shown in FIG. 25. Thus, nitrogen is segregated on the interface between the gate insulation films 17 and the semiconductor substrate 3 (nitrogen oxide process).

In this case, since the gate insulation film 17a in the memory cell region is thicker than the gate insulation film 17b in other regions, the concentration of nitrogen is relatively higher in the thinner gate insulation film 17b than in the thicker gate insulation film 17a. As a result, the Vth of MISFETs formed in the memory cell region can be made relatively, and intentionally higher than the Vth of MISFETs formed in other regions. Further description will be omitted because it will be the same as that for said mode 1 for carrying out the invention.

Such a mode 4 of carrying out the invention makes it possible to achieve the same effects as those available in the mode 1 for carrying out the invention.

While the invention conceived by the inventor has been specifically described based on modes for carrying out the same, the invention is not limited to said modes for carrying out the invention and may obviously be modified in various ways without departing from the principle thereof.

For example, the semiconductor wafer is not limited to single films made of silicon single crystals and may be modified in various ways. For example, an epitaxial wafer may be used which is obtained by forming a thin epitaxial layer (of 1 μm, for example) on the surface of a semiconductor substrate made of silicon single crystals, and, alternatively, an SOI (silicon on insulator) wafer may be used which is obtained by providing a semiconductor layer for forming elements on an insulated layer.

While the above description has been made on applications, of the invention made by the inventor to microprocessors incorporating SRAM memory cells which involve the field of application that is the background of the invention, the invention is not limited thereto and may be applied to, for example, semiconductor integrated circuit devices and the like constituted solely by an SRAM. Further, while said modes for carrying out the invention have referred to the use of six MISFET type SRAM cells, the invention is not limited thereto, and, for example, it is possible to use high resistance load type SRAM cells utilizing polysilicon resistors as load resistance elements and SRAM cells having the so-called TFT structure in which two polysilicon layers are provided on driving MISFETs to form a p-channel type MOSFET used as a load resistance element with the polysilicon layers. It may also be applied to semiconductor devices in which MISFETs forming an SRAM and other circuits, and bipolar transistors are formed on a semiconductor substrate.

Effects provided by typical aspects of the invention disclosed in the present specification can be briefly described as follows.

(1) The present invention makes it possible to improve the static noise margin (SNM) of an SRAM while improving the operating speed of a microprocessor incorporating an SRAM and reducing the power supply voltage of the same (i.e., reducing the power consumption).

(2) The present invention makes it possible to reduce the rate of occurrence of read faults and write faults of a memory of a microprocessor incorporating an SRAM.

(3) according to the above effects (1), (2), it is possible to improve the reliability of operation of a microprocessor incorporating an SRAM which can operate at a high speed with small power consumption.

What is claimed is:

1. A method for manufacturing a semiconductor integrated circuit device including a memory cell of an SRAM having a first p-channel MISFET and a first n-channel MISFET, and a peripheral circuit having a second p-channel MISFET and a second n-channel MISFET, comprising:

providing a semiconductor substrate having a memory cell forming region and a peripheral circuit forming region, wherein said memory cell forming region includes a first p-channel MISFET forming region where said first p-channel MISFET is to be formed and a first n-channel MISFET forming region where said first n-channel MISFET is to be formed, wherein said peripheral circuit forming region includes a second p-channel MISFET forming region where said second p-channel MISFET is to be formed and a second n-channel MISFET forming region where said second n-channel MISFET is to be formed;

selectively introducing a first impurity into said first p-channel MISFET forming region and said second p-channel MISFET forming region for controlling a threshold voltage;

selectively introducing a second impurity into said first n-channel MISFET forming region and said second n-channel MISFET forming region for controlling a threshold voltage;

selectively introducing a third impurity into said first p-channel MISFET forming region by using a mask covering said second p-channel MISFET forming region for controlling a threshold voltage such that a threshold voltage of said first p-channel MISFET is higher than a threshold voltage of said second p-channel MISFET; and selectively introducing a fourth impurity into said first n-channel MISFET forming region by using a mask covering said second n-channel MISFET forming region for controlling a threshold voltage such that a threshold voltage of said first n-channel MISFET is higher than a threshold voltage of said second n-channel MISFET.

2. A method for manufacturing a semiconductor integrated circuit device according to claim 1, further comprising:

forming a groove in said substrate for defining said first p-channel MISFET forming region, said first n-channel MISFET forming region, said second p-channel MISFET forming region and said second n-channel MISFET forming region; and burying an insulating film in said groove by polishing an insulating film formed over said substrate having said groove.

3. A method for manufacturing a semiconductor integrated circuit device according to claim 1, further comprising:

forming a gate electrodes of said first n-channel MISFET, said first p-channel MISFET, said second n-channel MISFET and said second p-channel MISFET; and forming a source and drain region of said first n-channel MISFET, said first p-channel MISFET, said second n-channel MISFET and said second p-channel MISFET.

4. A method for manufacturing a semiconductor integrated circuit device including a memory cell of an SRAM having a first p-channel MISFET and a first n-channel MISFET, and a peripheral circuit having a second p-channel MISFET, a second n-channel MISFET, comprising:

(a) providing a semiconductor substrate having a memory cell forming region and a peripheral circuit forming region, wherein said memory cell forming region includes a first p-channel MISFET forming region where said first p-channel MISFET is to be formed and a first n-channel MISFET forming region where said first n-channel MISFET is to be formed;

wherein said peripheral circuit forming region includes a second p-channel MISFET forming region where said second p-channel MISFET is to be formed and a second n-channel MISFET forming region where said second n-channel MISFET is to be formed;

(b) selectively introducing a first impurity into said first p-channel MISFET forming region and said second p-channel MISFET forming region for controlling a threshold voltage;

selectively introducing a second impurity into said first n-channel MISFET forming region and said second n-channel MISGET forming region for controlling a threshold voltage;

(c) selectively introducing a second impurity into said first n-channel MISFET forming region and said second n-channel MISFET forming region for controlling a threshold voltage;

(d) introducing a fourth impurity into said first n-channel MISFET forming region by using a mask covering said peripheral circuit forming region for controlling a threshold voltage such that a threshold voltage of said first n-channel MISFET is higher than threshold voltages of said second n-channel MISFET and said further MISFET;

(e) forming a mask pattern for exposing a first region where a MISFET having a relatively higher operating speed is to be formed in said peripheral circuit, wherein said mask pattern covers said memory cell forming region and a second region other than said first region in said peripheral circuit forming region; and (f) introducing a fifth impurity into said first region of said peripheral circuit forming region by using said mask pattern as a mask for controlling a threshold voltage such that a threshold voltage of said MISFET to be formed in said first region is lower than a threshold voltage of said MISFET to be formed in said second region.

5. A method for manufacturing a semiconductor integrated circuit device according to claim 4, wherein a thickness of a gate insulating film of said MISFET formed in said first region is thinner than a gate insulating film of said MISFET formed in said second region.

6. A method for manufacturing a semiconductor integrated circuit device according to claim 4, further comprising:

forming a groove in said substrate for defining said first p-channel MISFET forming region, said first n-channel MISFET forming region, said second p-channel MISFET forming region, said second n-channel MISFET forming region and said further MISFET forming region; and burying an insulating film in said groove by polishing an insulating film formed over said substrate having said groove.

7. A method for manufacturing a semiconductor integrated circuit device according to claim 4, further comprising:

forming a gate electrodes of said first n-channel MISFET, said first p-channel MISFET, said second n-channel MISFET and said second p-channel MISFET; and forming a source and drain region of said first n-channel MISFET, said first p-channel MISFET, said second n-channel MISFET and said second p-channel MISFET.

8. A method for manufacturing a semiconductor integrated circuit device including a memory cell of an SRAM having a first p-channel MISFET and a first n-channel MISFET, and a peripheral circuit having a second p-channel MISFET and a second n-channel MISFET, comprising:

providing a semiconductor substrate having a memory cell forming region and a peripheral circuit forming region, wherein said memory cell forming region includes a first p-channel MISFET forming region where said first p-channel MISFET is to be formed and a first n-channel MISFET forming region where said first n-channel MISFET is to be formed, wherein said peripheral circuit forming region includes a second p-channel MISFET forming region where said second p-channel MISFET is to be formed and a second n-channel MISFET forming region where said second n-channel MISFET is to be formed;

selectively introducing a first impurity into said first p-channel MISFET forming region for controlling a threshold voltage;

selectively introducing a second impurity into said first n-channel MISFET forming region and said second n-channel MISFET forming region for controlling a threshold voltage; and introducing a third impurity into said first p-channel MISFET forming region by using a mask covering said second p-channel MISFET forming region for controlling a threshold voltage such that a threshold voltage of said first p-channel MISFET is higher than a threshold voltage of said second p-channel MISFET.

9. A method for manufacturing a semiconductor integrated circuit device including a memory cell of an SRAM having a first p-channel MISFET and a first n-channel MISFET, and a peripheral circuit having a second p-channel MISFET and a second n-channel MISFET, comprising:

providing a semiconductor substrate having a memory cell forming region and a peripheral circuit forming region, wherein said memory cell forming region includes a first p-channel MISFET forming region where said first p-channel MISFET is to be formed and a first n-channel MISFET forming region where said first n-channel MISFET is to be formed, wherein said peripheral circuit forming region includes a second p-channel MISFET forming region where said second p-channel MISFET is to be formed and a second n-channel MISFET forming region where said second n-channel MISFET is to be formed;

selectively introducing a first impurity into said first p-channel MISFET forming region and said second p-channel MISFET forming region for controlling a threshold voltage;

selectively introducing a second impurity into said first n-channel MISFET forming region and said second n-channel MISFET forming region for controlling a threshold voltage;

forming a mask pattern for exposing a first region where a MISFET having a relatively higher operating speed is to be formed in said peripheral circuit forming region, wherein said mask pattern covers said memory cell forming region and a second region other than said first region in said peripheral circuit forming region;

introducing a third impurity into said first region of said peripheral circuit forming region by using said mask pattern as a mask for controlling a threshold voltage such that a threshold voltage of said MISFET to be formed in said first region is lower than a threshold voltage of said MISFET to be formed in said second region and a threshold voltage of said first p-channel MISFET of said memory cell.

10. A method for manufacturing a semiconductor integrated circuit device according to claim 9, wherein a thickness of a gate insulating film of said MISFET to be formed in said first region is thinner than a gate insulating film of said MISFET to be formed in said second region.

11. A method for manufacturing a semiconductor integrated circuit device according to claim 9, wherein said MISFET whose leak current must be reduced is formed in said second region.

12. A method for manufacturing a semiconductor integrated circuit device according to claim 9, further comprising:

forming a groove in said substrate for defining said first p-channel MISFET forming region, said first n-channel MISFET forming region, said second p-channel MISFET forming region, said second n-channel MISFET forming region and said further MISFET forming region; and burying an insulating film in said groove by polishing an insulating film formed over said substrate having said groove.

13. A method for manufacturing a semiconductor integrated circuit device according to claim 9, further comprising the steps of:

forming a gate electrodes of said first n-channel MISFET, said first p-channel MISFET, said second n-channel MISFET and said second p-channel MISFET; and forming a source and drain region of said first n-channel MISFET, said first p-channel MISFET, said second n-channel MISFET and said second p-channel MISFET.

14. A method for manufacturing a semiconductor integrated circuit device including a memory cell of an SRAM having a first p-channel MISFET and a first n-channel MISFET, and a peripheral circuit having a second p-channel MISFET and a second n-channel MISFET, comprising:

providing a semiconductor substrate having a memory cell forming region and a peripheral circuit forming region, wherein said memory cell forming region includes a first p-channel MISFET forming region where said first p-channel MISFET is to be formed and a first n-channel MISFET forming region where said first n-channel MISFET is to be formed, wherein said peripheral circuit forming region includes a second p-channel MISFET forming region where said second p=channel MISFET is to be formed and a second n-channel MISFET forming region where said second n-channel MISFET is to be formed;

selectively introducing a first impurity into said first p-channel MISFET forming region and said second p-channel MISFET forming region for controlling a threshold voltage;

selectively introducing a second impurity into said first n-channel MISFET forming region and said second n-channel MISFET forming region for controlling a threshold voltage;

forming a mask pattern for exposing a first region where a MISFET having a relatively higher operating speed is to be formed in said peripheral circuit forming region, wherein said mask pattern covers said memory cell forming region and a second region other than said first region in said peripheral circuit forming region;

introducing a third impurity into said first region of said peripheral circuit forming region by using said mask pattern as a mask for controlling a threshold voltage such that a threshold voltage of said MISFET to be formed in said first region is lower than a threshold voltage of said first n-channel MISFET of said memory cell.

15. A method for manufacturing a semiconductor integrated circuit device according to claim 14, wherein a thickness of a gate insulating film of said MISFET to be formed in said first region is thinner than a gate insulating film of said MISFET to be formed in said second region.

16. A method for manufacturing a semiconductor integrated circuit device according to claim 14, wherein said MISFET whose leak current must be reduced is formed in said second region.

17. A method for manufacturing a semiconductor integrated circuit device according to claim 14, further comprising the steps of:

forming a groove in said substrate for defining said first p-channel MISFET forming region, said first n-channel MISFET forming region, said second p-channel MISFET forming region, said second n-channel MISFET forming region and said further MISFET forming region; and burying an insulating film in said groove by polishing an insulating film formed over said substrate having said groove.

* * * * *